(12) United States Patent
Lee et al.

(10) Patent No.: US 12,057,537 B2
(45) Date of Patent: Aug. 6, 2024

(54) SEMICONDUCTOR DEVICE AND LIGHT EMITTING ELEMENT PACKAGE INCLUDING SAME

(71) Applicant: SUZHOU LEKIN SEMICONDUCTOR CO., LTD., Taicang (CN)

(72) Inventors: Sang Youl Lee, Seoul (KR); Ki Man Kang, Seoul (KR); Ji Hyung Moon, Seoul (KR); Yoon Min Jo, Seoul (KR)

(73) Assignee: SUZHOU LEKIN SEMICONDUCTOR CO., LTD., Taicang (CN)

( * ) Notice: Subject to any disclaimer, the term of this patent is extended or adjusted under 35 U.S.C. 154(b) by 958 days.

(21) Appl. No.: 16/981,238

(22) PCT Filed: Mar. 15, 2019

(86) PCT No.: PCT/KR2019/003055
§ 371 (c)(1),
(2) Date: Sep. 15, 2020

(87) PCT Pub. No.: WO2019/177423
PCT Pub. Date: Sep. 19, 2019

(65) Prior Publication Data
US 2021/0066563 A1     Mar. 4, 2021

(30) Foreign Application Priority Data

Mar. 15, 2018  (KR) .................. 10-2018-0030524
Apr. 6, 2018   (KR) .................. 10-2018-0040676
Sep. 3, 2018   (KR) .................. 10-2018-0104803

(51) Int. Cl.
*H01L 33/62*    (2010.01)
*G09G 3/32*     (2016.01)
*H01L 25/075*   (2006.01)

(52) U.S. Cl.
CPC ............... *H01L 33/62* (2013.01); *G09G 3/32* (2013.01); *H01L 25/0753* (2013.01)

(58) Field of Classification Search
CPC ..... H01L 33/62; H01L 25/0753; H01L 33/22; H01L 33/382; G09G 3/32; G09G 2300/0426; F21S 41/153; F21S 41/663
See application file for complete search history.

(56) References Cited

U.S. PATENT DOCUMENTS

2014/0110730 A1 *  4/2014  Lee ................... H01L 25/0753
                                                     257/88
2014/0175978 A1    6/2014  Kobayashi
2017/0256520 A1 *  9/2017  Moon ................ H01L 25/0753

FOREIGN PATENT DOCUMENTS

JP   2013-054956 A    3/2013
JP   2017-212340 A   11/2017
(Continued)

*Primary Examiner* — Ratisha Mehta
(74) *Attorney, Agent, or Firm* — Birch, Stewart, Kolasch & Birch, LLP

(57) ABSTRACT

Disclosed in an embodiment are a semiconductor device and a light-emitting device package including same, the semiconductor device comprising: a substrate; a plurality of semiconductor structures arranged in a matrix shape in the central area of the substrate; passivation layers arranged on upper surfaces and lateral surfaces of the semiconductor structures and on the edge area of the substrate; a plurality of first wiring lines which are arranged at lower parts of the plurality of semiconductor structures and electrically connected thereto, and which include first end parts extending from the central area to the edge area of the substrate; a plurality of second wiring lines which are arranged at the lower parts of the plurality of semiconductor structures and electrically connected thereto, and which include second end parts extending from the central area to the edge area of the substrate; a plurality of first pads penetrating the passivation (Continued)

layer so as to be connected to the plurality of first end parts; and a plurality of second pads penetrating the passivation layers so as to be connected to the plurality of second end parts, wherein the plurality of semiconductor structures include a plurality of first semiconductor structures, which are arranged in a first area of the central area, and a plurality of second semiconductor structures, which are arranged in a second area of the central area, and the size of the plurality of first semiconductor structures differs from the size of the plurality of second semiconductor structures.

20 Claims, 22 Drawing Sheets

(56) References Cited

FOREIGN PATENT DOCUMENTS

| | | |
|---|---|---|
| KR | 10-2009-0088643 A | 8/2009 |
| KR | 10-0986570 B1 | 10/2010 |
| KR | 10-2011-0098600 A | 9/2011 |
| KR | 10-2014-0068474 A | 6/2014 |
| KR | 10-2016-0096739 A | 8/2016 |
| KR | 10-2017-0046205 A | 5/2017 |
| KR | 10-1780317 B1 | 7/2017 |
| KR | 10-2017-0104031 A | 9/2017 |
| KR | 10-2017-0133717 A | 12/2017 |
| KR | 10-2016-0045399 A | 4/2018 |

* cited by examiner

[FIG.5]
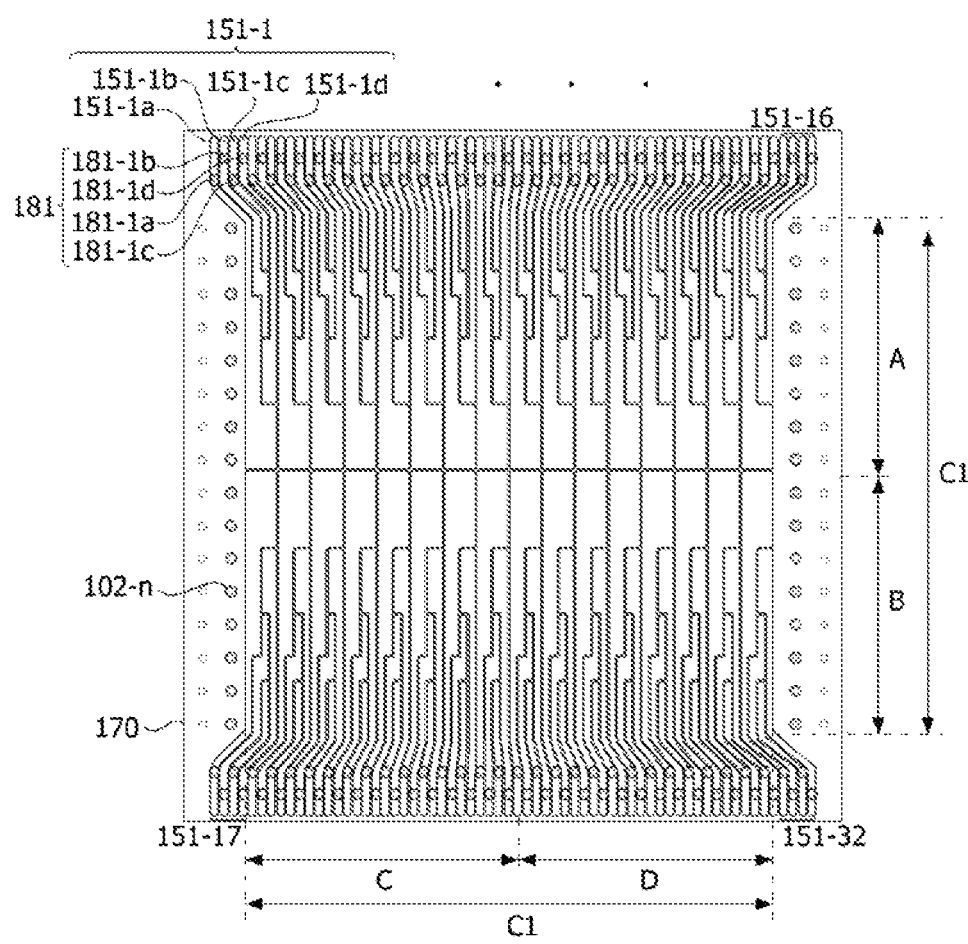

[FIG.6]
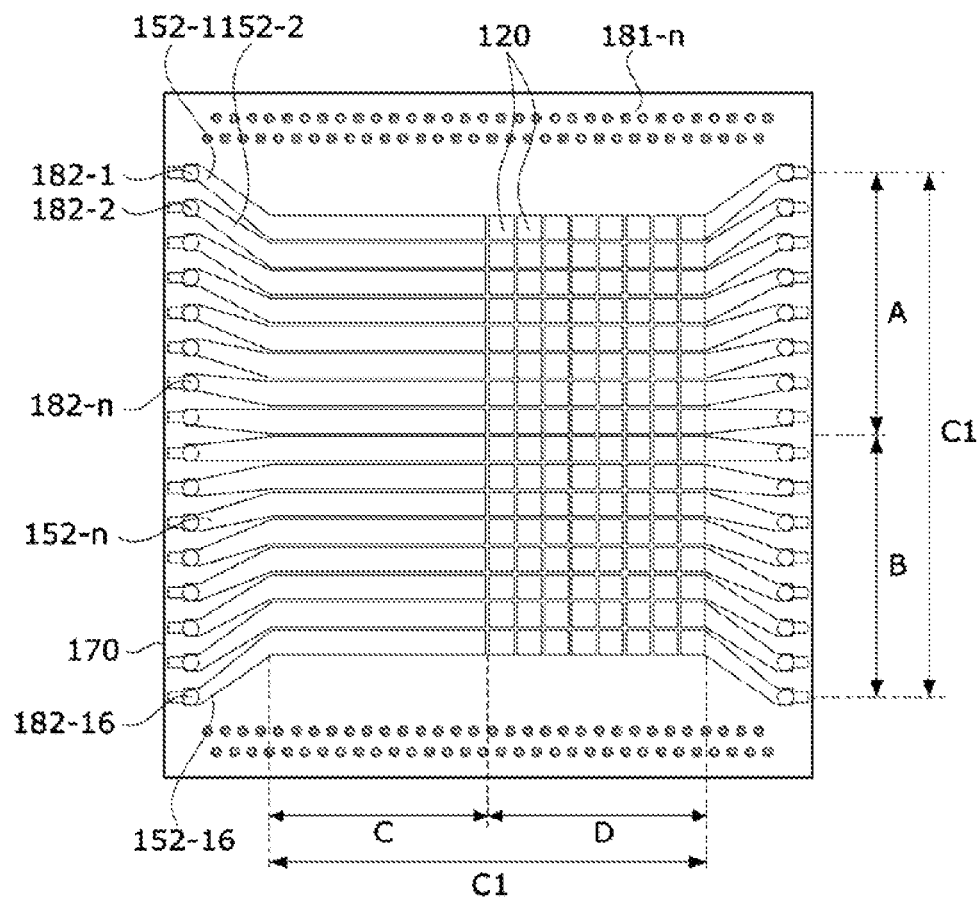

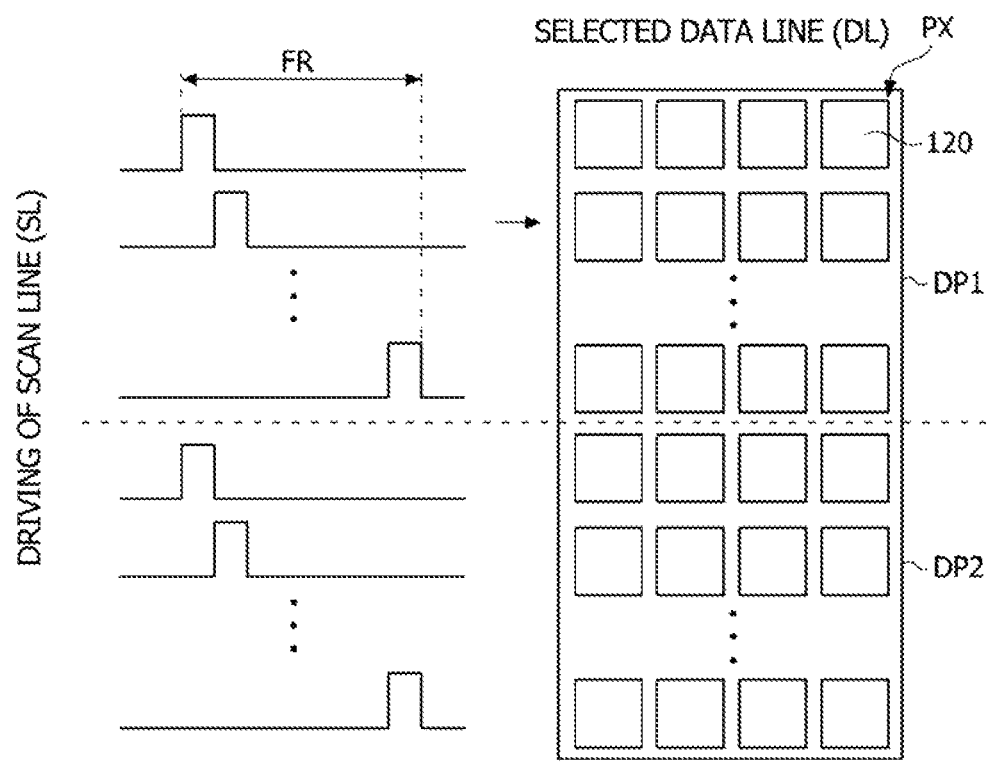
[FIG.7]

[FIG.8]
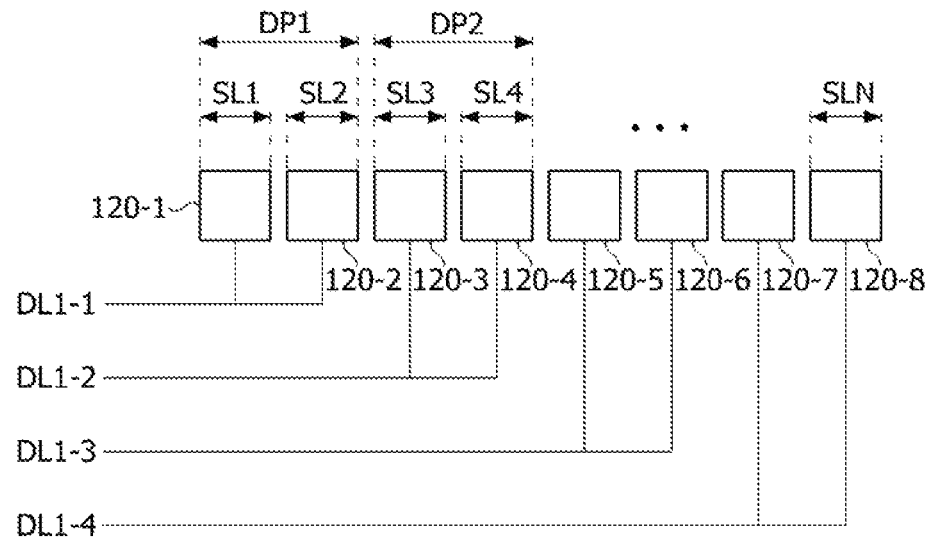
[FIG.9]
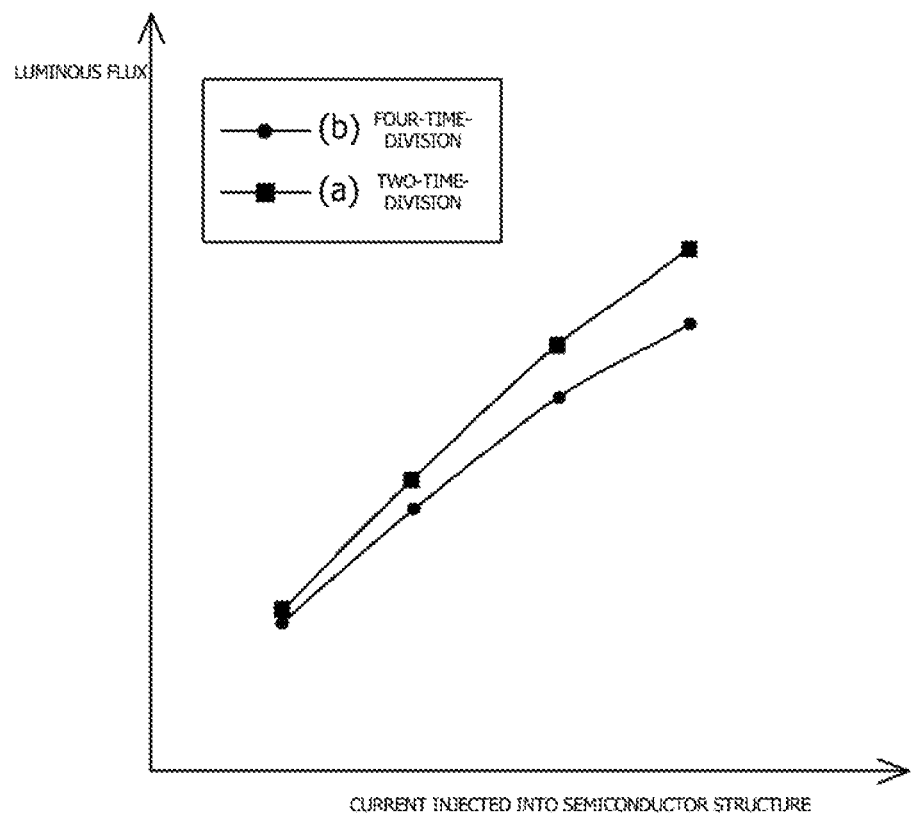

[FIG.10]
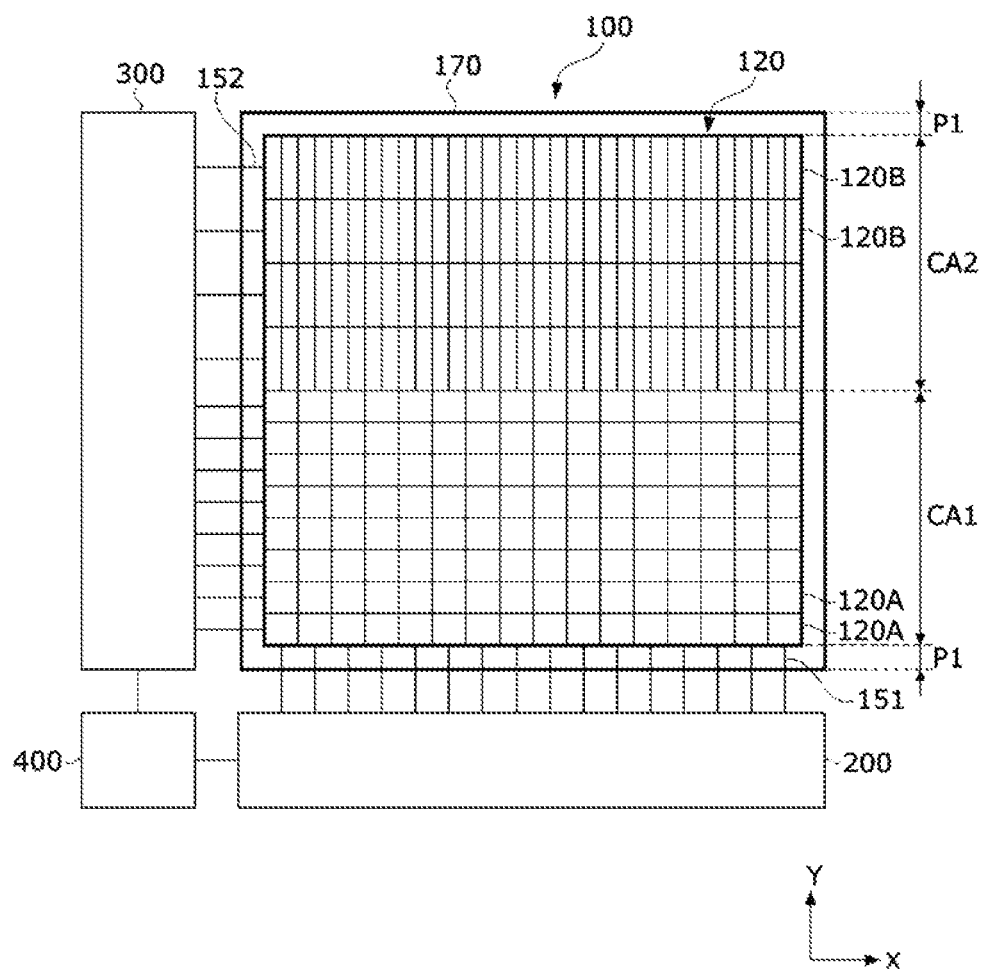

[FIG.11]
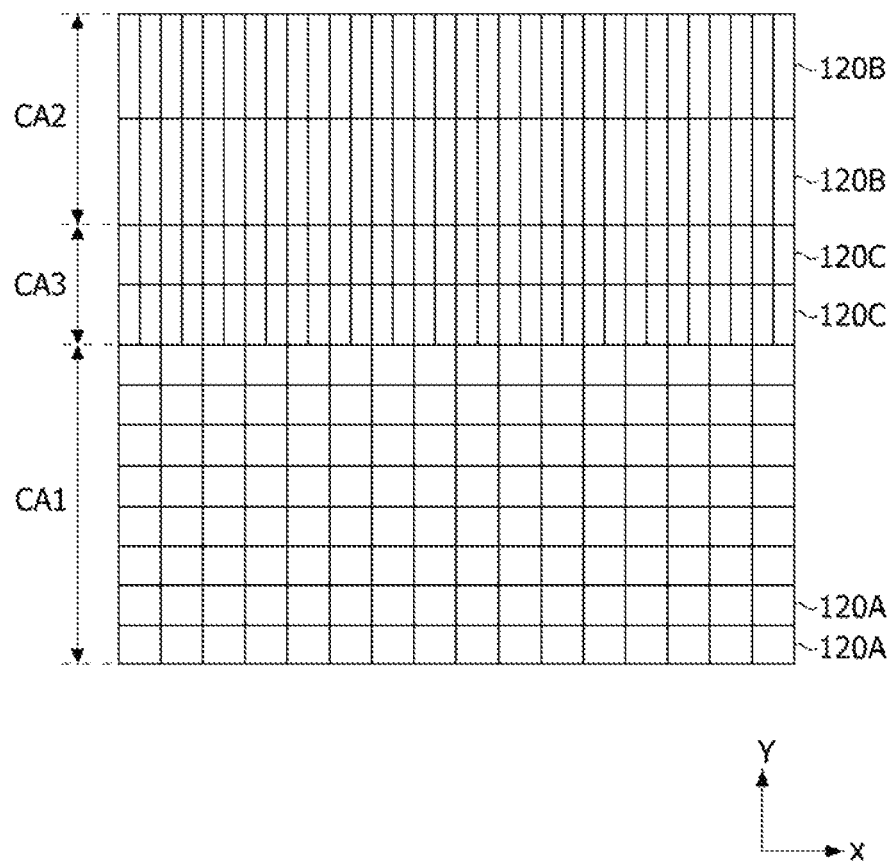

[FIG.12]
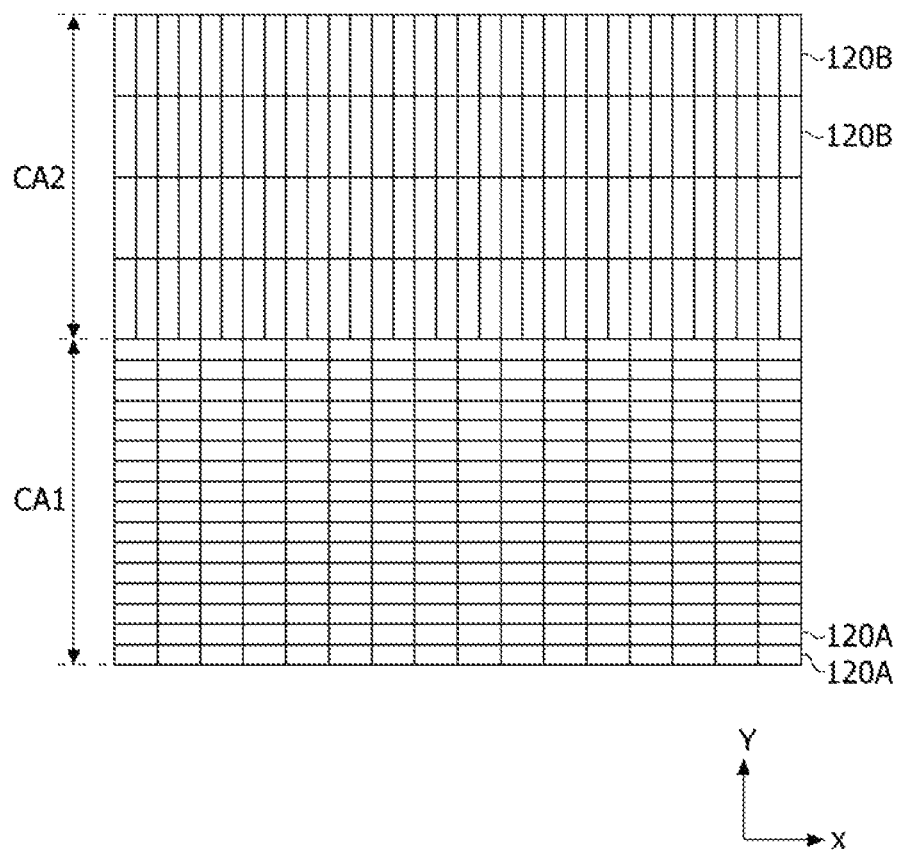

[FIG.13]
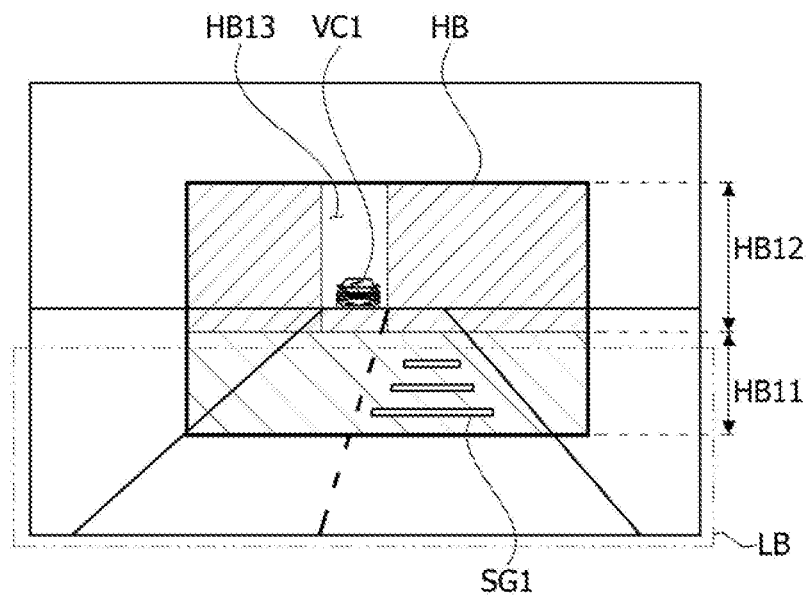

[FIG.14]
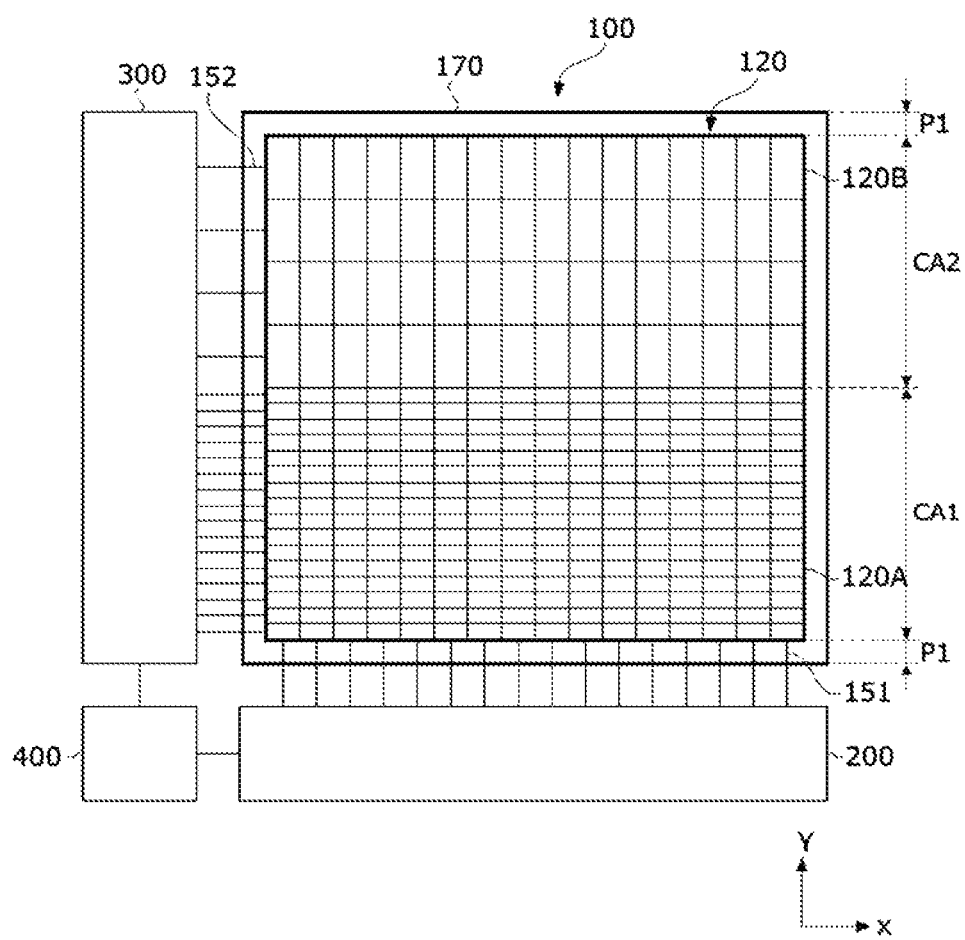

【FIG.15】
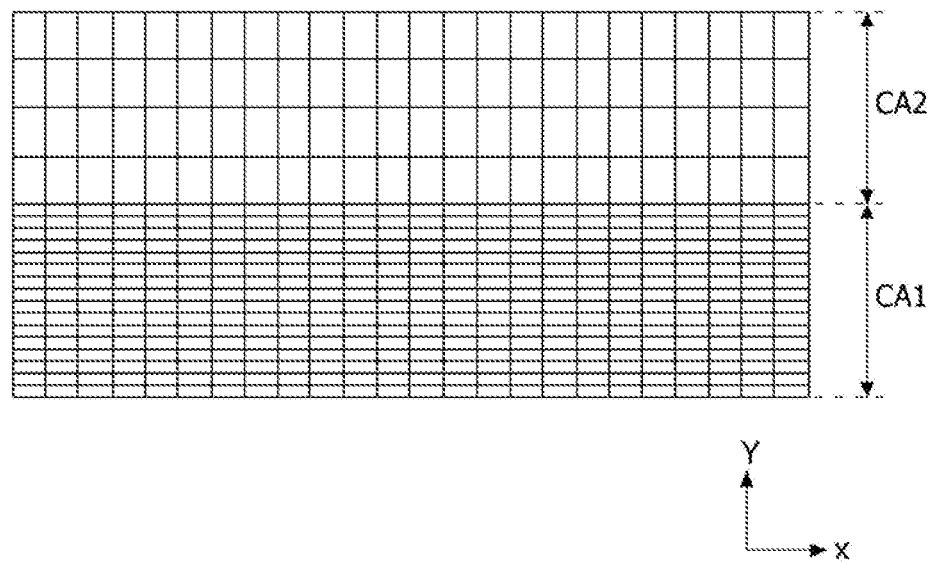
【FIG.16】
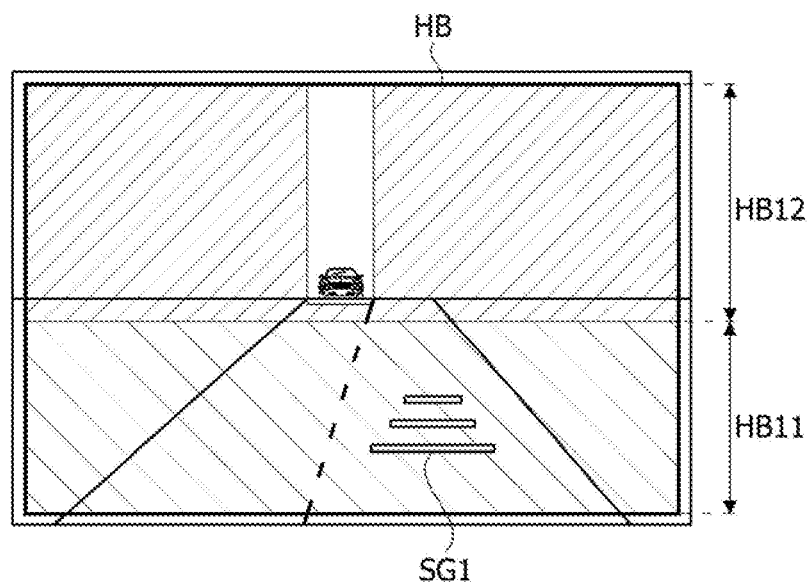

[FIG.17]
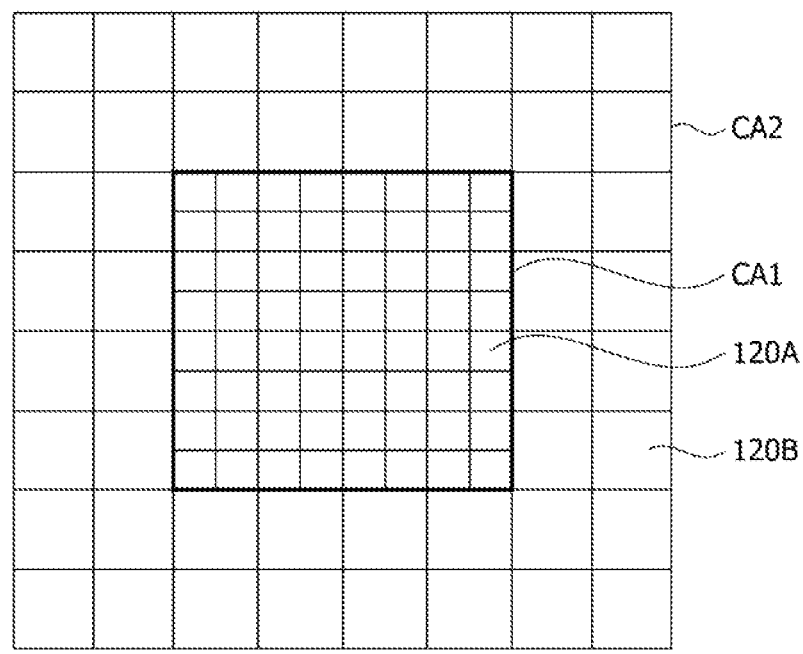

[FIG.19]
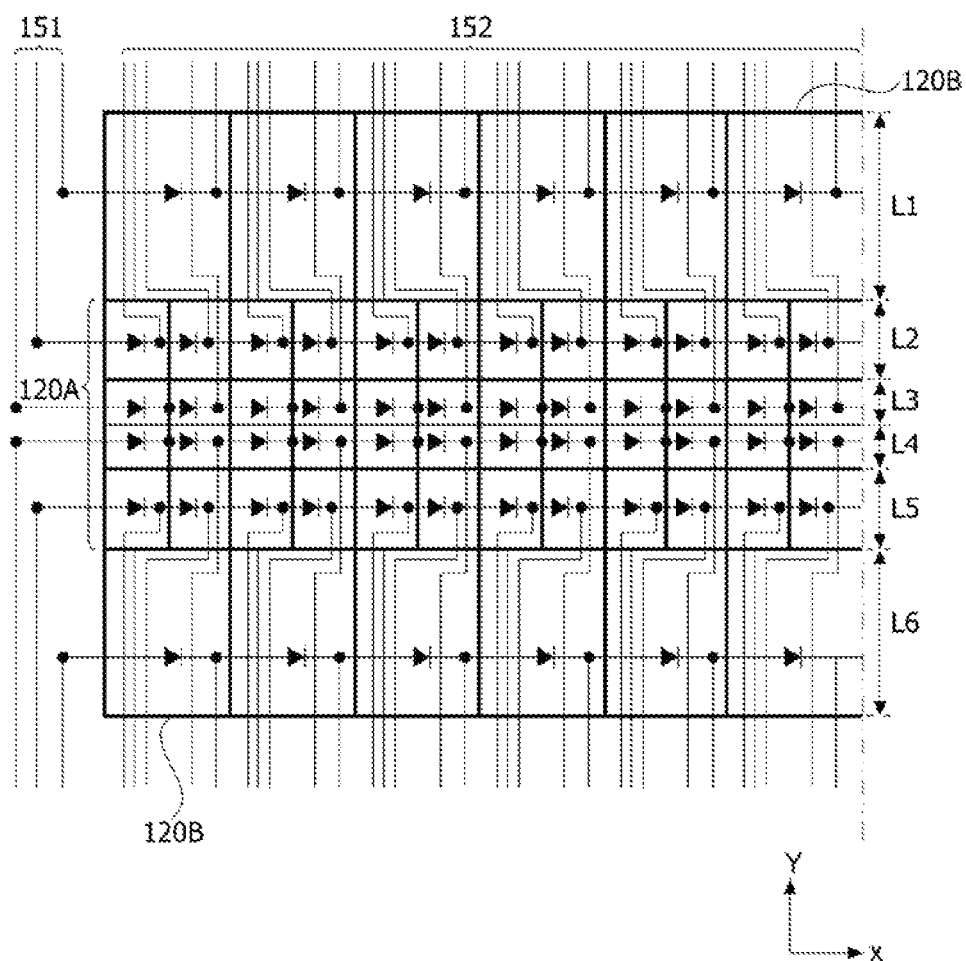

[FIG.20]
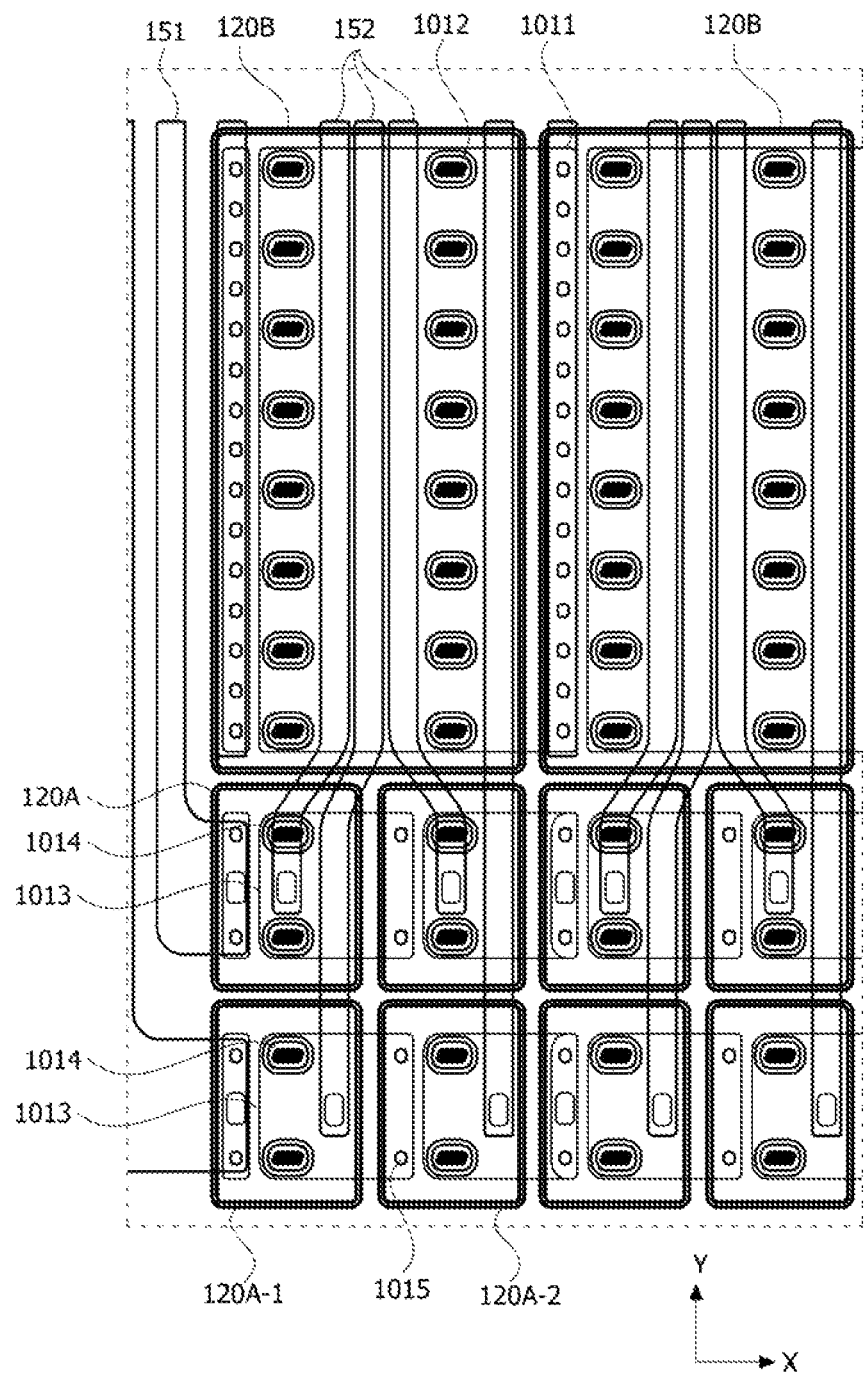

[FIG.21]
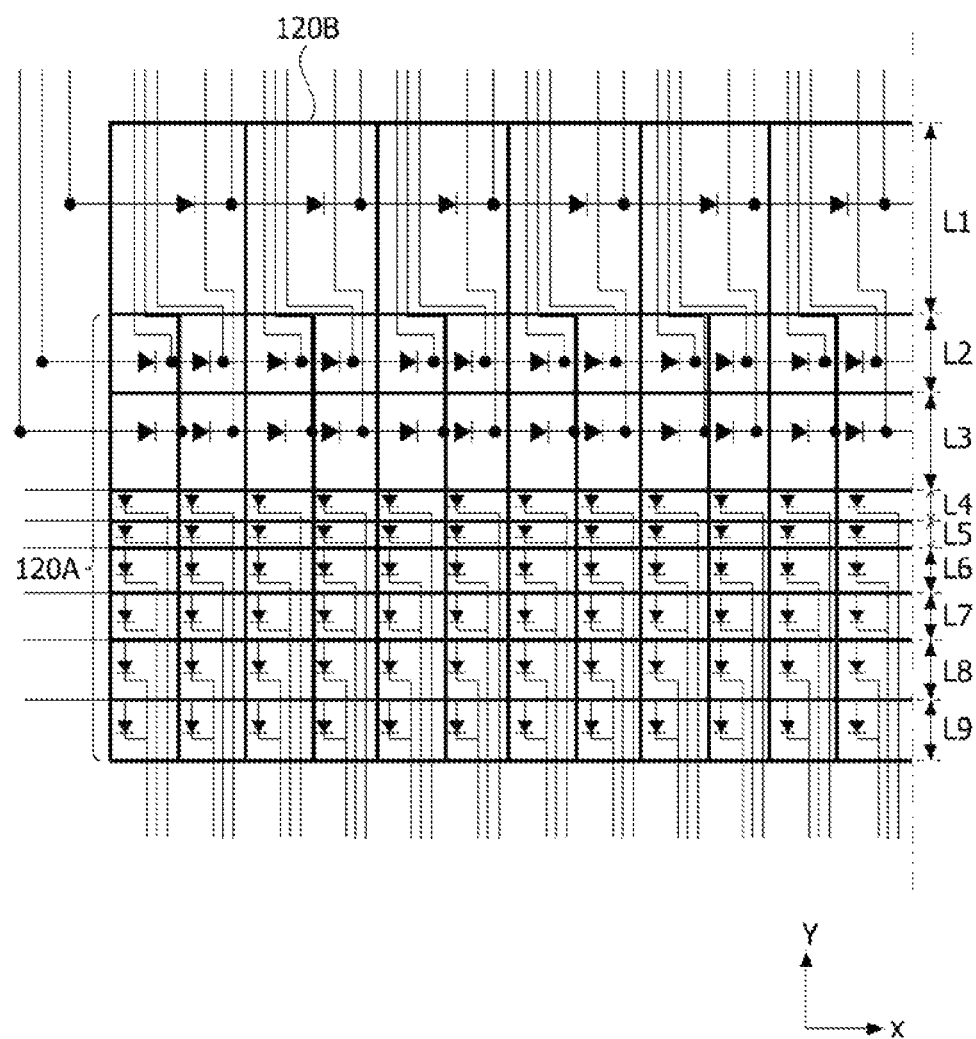

[FIG.22]
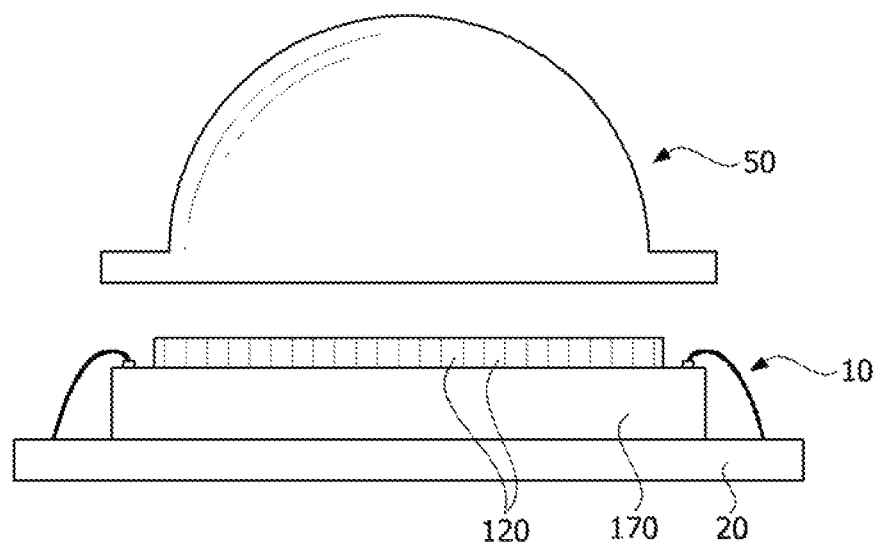
[FIG.23]
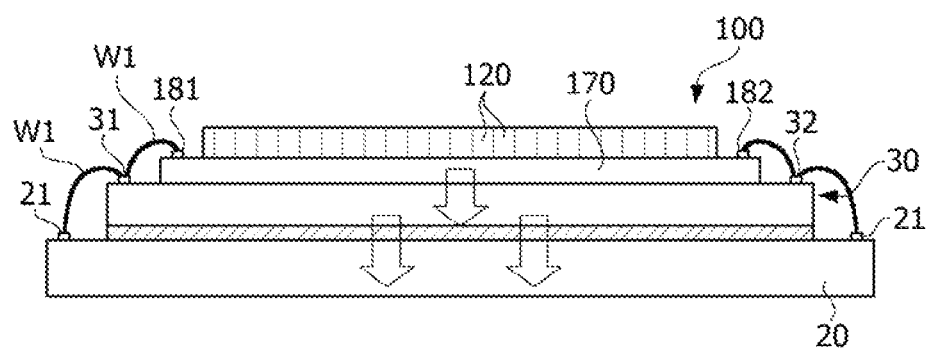

[FIG.24]
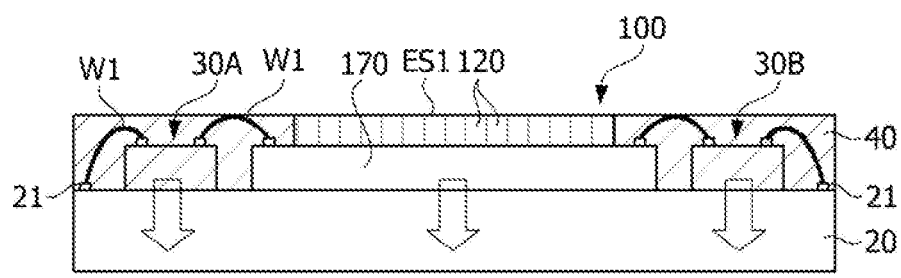
[FIG.25]
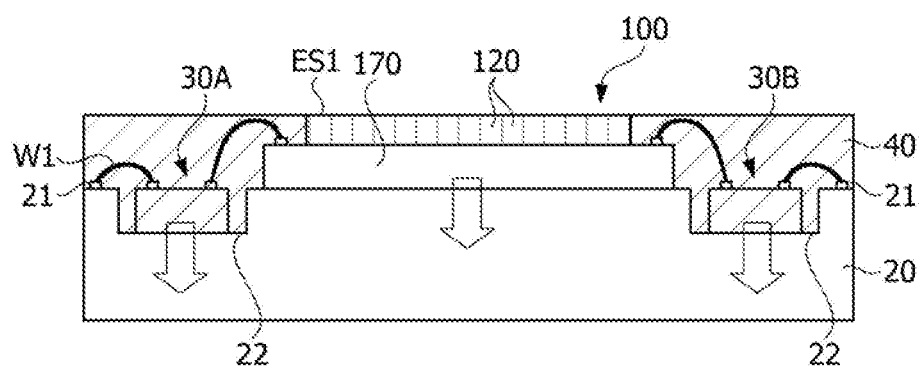

SEMICONDUCTOR DEVICE AND LIGHT EMITTING ELEMENT PACKAGE INCLUDING SAME

CROSS REFERENCE TO RELATED APPLICATIONS

This application is the National Phase of PCT International Application No. PCT/KR2019/003055, filed on Mar. 15, 2019, which claims priority under 35 U.S.C. 119(a) to Patent Application No. 10-2018-0030524, filed in the Republic of Korea on Mar. 15, 2018, Patent Application No. 10-2018-0040676, filed in the Republic of Korea on Apr. 6, 2018, and Patent Application No. 10-2018-0104803, filed in the Republic of Korea on Sep. 3, 2018, all of which are hereby expressly incorporated by reference into the present application.

TECHNICAL FIELD

Embodiments relate to a semiconductor device and a light-emitting device package including the same.

BACKGROUND ART

Semiconductor devices including compounds such as GaN and AlGaN have many merits such as wide and adjustable band gap energy and thus may be variously used as light-emitting devices, light-receiving elements, various kinds of diodes, or the like.

In particular, light-emitting devices such as a light-emitting diode or a laser diode using group III-V or II-VI compound semiconductor materials may implement various colors such as red, green, blue, and ultraviolet rays due to the development of thin-film growth technology and element materials and may implement efficient white light rays by using fluorescent materials or combining colors. These light-emitting devices also have advantages with respect to low power consumption, semi-permanent life span, fast response time, safety, and environmental friendliness compared to conventional light sources such as a fluorescent lamp, an incandescent lamp, or the like.

In addition, when light-receiving elements such as optical detectors or solar cells are produced using group III-V or II-VI compound semiconductor materials, light may be used in various wavelength ranges from gamma rays to radio wavelength regions by generating an optical current by light absorption in various wavelength ranges through the development of element materials. Also, such semiconductor devices have the advantages of fast response time, stability, environmental friendliness, and ease of adjustment of device materials and thus may be easily used for power control or microwave circuits or communication modules.

Accordingly, the application of semiconductor devices is expanding to transmission modules of optical communication means, light-emitting diode backlights substituted for cold cathode fluorescence lamps (CCFL) forming the backlights of liquid crystal display (LCD) devices, white light-emitting diode lamps to be substituted for fluorescent bulbs or incandescent bulbs, car headlamps, traffic lights, sensors for detecting gas or fire, and the like. Also, the application of semiconductor devices may expand even to high-frequency application circuits or other power control devices, and communication modules.

In the case of a car headlamp, multiple light-emitting devices (chips) may be used in a package. In particular, recently, in recent years, the interest in headlamps allowing independent lighting (dimming) of multiple chips is increasing.

However, when dimming control is performed to prevent a driver from being dazzled in a vehicle traveling on the opposite side, forward visibility is degraded. Thus, the risk of accidents increases because drivers do not recognize an object ahead.

Also, high resolution is not required to secure visibility and prevent dazzling but is required to output an image or text on a road surface. Accordingly, in order to simultaneously perform these functions, structural complexity is increased.

Also, when a light-emitting device package is disposed on a driving unit, the reliability of a light-emitting device is degraded due to heat emitted from the driving unit.

DISCLOSURE

Technical Problem

Embodiments provide a light-emitting device package capable of ensuring forward visibility even when dimming control is performed.

Also, embodiments provide a light-emitting device package capable of reducing heat generation in a driving unit.

Also, embodiments provide a light-emitting device package having different semiconductor structures.

Also, embodiments provide a light-emitting device package capable of performing time-division control on semiconductor structures of different sizes independently.

Also, embodiments provide a light-emitting device package having excellent heat dissipation performance.

Problems to be solved in the embodiments are not limited thereto and include the following technical solutions and also objectives or effects understandable from the embodiments.

Technical Solution

According to an aspect of the present invention, there is provided a semiconductor device including a substrate; a plurality of semiconductor structures arranged in a matrix form and in a central region of the substrate; a passivation layer disposed on upper surfaces and lateral surfaces of the semiconductor structures and in an edge region of the substrate; a plurality of first wiring lines disposed below and electrically connected to the plurality of semiconductor structures, the first wiring lines including first end parts extending from the central region to the edge region of the substrate; a plurality of second wiring lines disposed below and electrically connected to the plurality of semiconductor structures, the second wiring lines including second end parts extending from the central region to the edge region of the substrate; a plurality of first pads connected to the plurality of first end parts through the passivation layer; and a plurality of second pads connected to the plurality of second end parts through the passivation layer, wherein the plurality of semiconductor structures include a plurality of first semiconductor structures disposed in a first region of the central region and a plurality of second semiconductor structures disposed in a second region of the central region, and the plurality of first semiconductor structures have a different size from the plurality of second semiconductor structures.

The plurality of semiconductor structures may be spaced apart from one another in a first direction and a second direction perpendicular to the first direction, the first end parts of the plurality of first wiring lines may extend in the first direction from the central region, and the second end parts of the plurality of second wiring lines may extend in the second direction from the central region.

The first region may be equal in area to the second region.

The number of first semiconductor structures disposed in the first region may be greater than the number of second semiconductor structures disposed in the second region.

The first semiconductor structures disposed in the first region may be smaller than the second semiconductor structures disposed in the second region.

A width of the second semiconductor structures in the first direction may be smaller than a width of the first semiconductor structures in the first direction.

The first region and the second region may be disposed in the second direction.

The semiconductor device may include a connection electrode configured to electrically connect the semiconductor structures disposed in the first direction among the plurality of semiconductor structures, wherein the first wiring lines and the second wiring lines may extend from the central region to the edge region of the substrate, and the connection electrode may electrically connect a first conductive semiconductor layer of one semiconductor structure to a second conductive semiconductor layer of an adjacent semiconductor structure.

According to another aspect of the present invention, there is a semiconductor device package including a circuit board; a semiconductor device disposed on the circuit board; a driving unit disposed on the circuit board and spaced apart from the semiconductor device; a plurality of wires configured to connect the semiconductor device to the driving unit; and a molding member disposed on the circuit board to cover the driving unit, wherein the semiconductor device may include a substrate; a plurality of semiconductor structures arranged in a matrix form and in a central region of the substrate; a passivation layer disposed on upper and lateral surfaces of the semiconductor structures and in an edge region of the substrate; a plurality of first wiring lines disposed below and electrically connected to the plurality of semiconductor structures, the first wiring lines including first end parts extending from the central region to the edge region of the substrate; a plurality of second wiring lines disposed below and electrically connected to the plurality of semiconductor structures, the second wiring lines including second end parts extending from the central region to the edge region of the substrate; a plurality of first pads connected to the plurality of first end parts through the passivation layer; and a plurality of second pads connected to the plurality of second end parts through the passivation layer, wherein the plurality of semiconductor structures include a plurality of first semiconductor structures disposed in a first region of the central region and a plurality of second semiconductor structures disposed in a second region of the central region, the plurality of first semiconductor structures have a different size from the plurality of second semiconductor structures, and the plurality of wires electrically connect the plurality of first pads and the plurality of second pads to the driving unit.

The driving unit may include a first driving unit disposed on one side of the semiconductor device on the circuit board; and a second driving unit disposed on the other side of the semiconductor device on the circuit board, and the circuit board may include recesses for accommodating the first driving unit and the second driving unit.

Advantageous Effects

According to an embodiment, it is possible to improve the reliability of a light-emitting device by effectively dissipating heat emitted from a driving unit.

Also, it is possible to secure visibility, prevent dazzling, and display information on a road surface in one light-emitting device package.

Also, since forward visibility can be secured, it is possible to simplify a separate device mounted to display information on a road surface.

Also, since a plurality of functions are possible in one light-emitting device package, it is possible to reduce manufacturing costs.

Various advantageous merits and effects of the present invention are not limited to the above-descriptions and will be easily understood while embodiments of the present invention are described in detail.

DESCRIPTION OF DRAWINGS

FIG. 5 is a diagram showing a first wiring line of FIG. 3.

FIG. 6 is a diagram showing a second wiring line of FIG. 3.

FIGS. 7 and 8 are diagrams illustrating a manual matrix driving scheme according to an embodiment.

FIG. 9 is a diagram illustrating the effect of a light-emitting device package according to an embodiment.

FIG. 10 is a conceptual view of a light-emitting device package according to another embodiment of the present invention.

FIG. 11 is a first modification of the semiconductor structure.

FIG. 12 is a second modification of the semiconductor structure.

FIG. 13 is a diagram showing a field of view (FOV) of a headlamp.

FIG. 14 is a third modification of the semiconductor structure.

FIG. 15 is a fourth modification of the semiconductor structure.

FIG. 16 is a diagram showing an FOV covered by the semiconductor structure of FIG. 15.

FIG. 17 is a fifth modification of the semiconductor structure.

FIG. 19 is a conceptual view showing a structure in which semiconductor structures of a headlamp are connected in series according to an embodiment.

FIG. 20 is a plan view showing a structure in which semiconductor structures of a headlamp are connected in series according to an embodiment.

FIG. 21 is a conventional view showing a structure in which semiconductor structures of a headlamp are connected in series or in parallel according to an embodiment.

FIG. 22 is a diagram showing a lamp structure in which a light-emitting device package is combined with an optical system.

FIG. 23 is a conceptual view of a light-emitting device package according to an embodiment of the present invention.

FIG. 24 is a conceptual view of a light-emitting device package according to another embodiment of the present invention.

FIG. 25 is a conceptual view of a light-emitting device package according to still another embodiment of the present invention.

MODE FOR CARRYING OUT THE INVENTION

Figure 1:
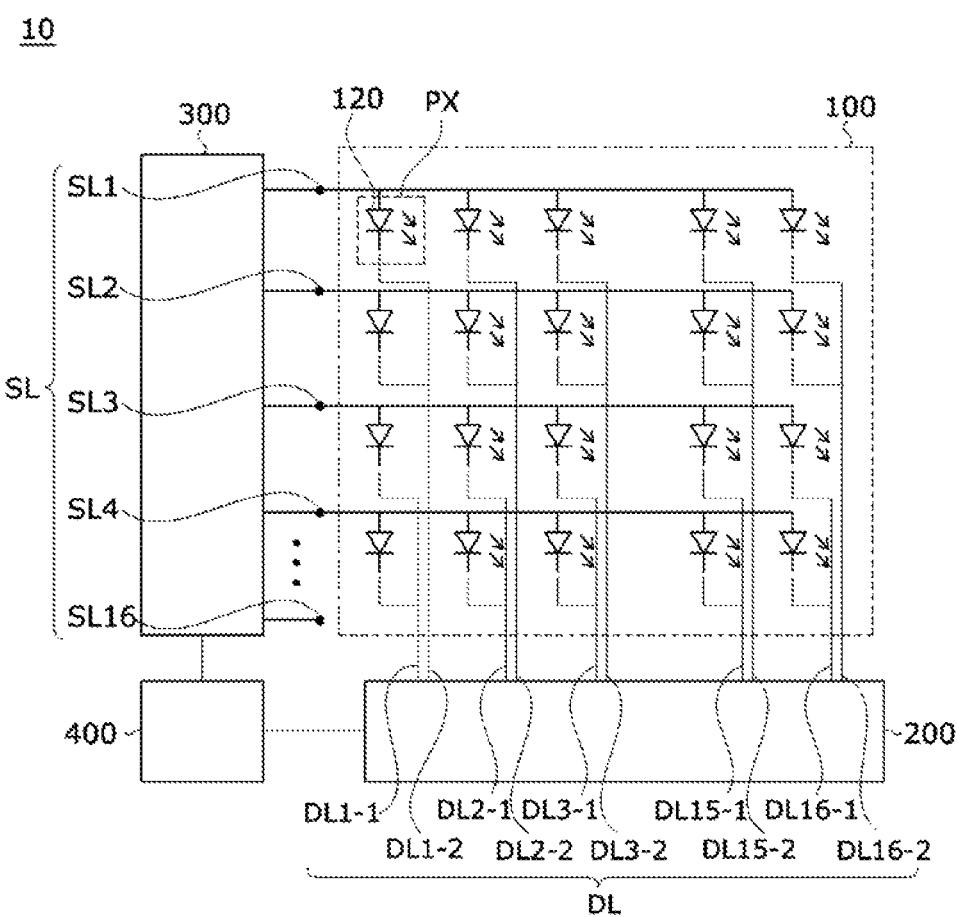
FIG. 1 is a conceptual view showing a light-emitting device package according to an embodiment of the present invention.

The present invention may be variously modified and have several example embodiments, and specific embodiments will be shown in the accompanying drawings and be described in detail. It should be understood, however, that there is no intent to limit the invention to the particular forms disclosed, but on the contrary, the invention is to cover all modifications, equivalents, and alternatives falling within the spirit and scope of the invention.

Although the terms "first," "second," etc., may be used herein to describe various elements, these elements should not be limited by these terms. These terms are only used to distinguish one element from another. For example, a first element may be called a second element, and a second element may also be called a first element without departing from the scope of the present invention. The term "and/or" means any one or a combination of a plurality of related items.

It will be understood that when an element is referred to as being "connected" or "coupled" to another element, it can be directly connected or coupled to the other element or intervening elements may be present. Conversely, when an element is referred to as being "directly connected" or "directly coupled" to another element, there are no intervening elements present.

The terminology used herein is for the purpose of describing particular embodiments only and is not intended to limit the invention. As used herein, the singular forms "a," "an," and "one" are intended to include the plural forms as well, unless the context clearly indicates otherwise. It will be further understood that the terms "comprises," "comprising," "includes," and/or "including" when used herein, specify the presence of stated features, integers, steps, operations, elements, components, or combinations thereof but do not preclude the presence or addition of one or more other features, integers, steps, operations, elements, components, and/or combinations thereof.

Unless otherwise defined, all terms (including technical and scientific terms) used herein have the same meaning as commonly understood by those skilled in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments will be described in detail with reference to the accompanying drawings. The same reference numerals are given to the same or equivalent elements throughout the drawings and redundant descriptions thereof will be omitted.

A semiconductor device according to this embodiment may be a light-emitting device.

Such a semiconductor device emits light by recombination of electrons and holes, and the wavelength of the light is determined by a material-specific energy band gap. Therefore, the emitted light may vary depending on the composition of the material.

Hereinafter, example embodiments of the present invention will be described in detail with reference to the accompanying drawings so that they can be easily practiced by those skilled in the art.

FIG. 1 is a conceptual view showing a light-emitting device package according to an embodiment of the present invention.

Referring to FIG. 1, a light-emitting device package 10 according to an embodiment may include a semiconductor device 100 including a plurality of semiconductor structures 120, a plurality of data lines DL, a plurality of scan lines SL, a first driving unit 200, a second driving unit 300, and a controller 400. However, at least one of the first driving unit 200, the second driving unit 300, and the controller 400 may be omitted depending on the production method.

The semiconductor device 100 may include the plurality of semiconductor structures 120 arranged in a matrix form. Each of the plurality of semiconductor structures 120 may be one pixel PX. The matrix form may be defined as a form in which a plurality of semiconductor structures are disposed in a traverse direction to form one line and in which a plurality of such lines are disposed in a longitudinal direction.

The plurality of data lines DL may be electrically connected to a first wiring line connected to the plurality of semiconductor structures 120. The connection of the plurality of data lines DL to the semiconductor structures 120 may differ depending on the driving scheme of the light-emitting device package 10.

For example, the light-emitting device package 10 may be driven based on two-time-division while passive matrix driving is performed. In this case, the plurality of data lines DL may be electrically connected to a first wiring line connected to two semiconductor structures 120. However, as described above, the connection scheme of the plurality of data lines DL to the first wiring line may differ depending on the number of times of time-division. For example, in a passive matrix which is driven based on four-time-division, one data line DL may be electrically connected to four semiconductor structure 120.

A structure in which each data line DL is connected to two semiconductor structures will be described below. Also, the light-emitting device package 10 will be described on the basis of driving based on two-time-division (i.e., the number of times of time-division is two). However, this embodiment is not limited thereto and may have various time-division configurations.

The plurality of data lines DL may apply electric current to the semiconductor structures according to a signal provided from the first driving unit 200. A plurality of switches (not shown) are disposed on the plurality of data lines DL, and the first driving unit 200 may provide a control signal for switching (turning on or off) the plurality of switches (not shown) to the plurality of switches (not shown). The control signal may be a pulse-width modulation (PWM) signal. However, the present invention is not limited to such a type.

Also, the plurality of switches (not shown) may include a transistor, which may be, for example, a field-effect transistor (FET). Accordingly, the first driving unit 200 may control the plurality of switches (not shown) by adjusting a gate voltage applied to the plurality of switches (not shown). However, the present invention is not limited to such a type.

The plurality of scan lines SL may be electrically connected to a second wiring line connected to the plurality of semiconductor structures 120. Like the data lines DL described above, the connection of the plurality of scan lines SL to the semiconductor structures 120 may differ depending on the driving scheme of the light-emitting device package 10. For example, the light-emitting device package 10 may be driven based on two-time-division while passive matrix driving is performed. In this case, the plurality of scan lines SL may be electrically connected to a second wiring line connected to two semiconductor structures 120. However, as described above, the connection method of the plurality of scan lines SL to the second wiring line may differ depending on the number of times of time-division.

The plurality of data lines DL may be electrically connected to a first conductive semiconductor layer of a semiconductor structure 120 through a first wiring line, and the plurality of scan lines SL may be electrically connected to a second conductive semiconductor layer of a second semiconductor structure 120 through a second wiring line. Through this configuration, the plurality of data lines DL and the plurality of scan lines SL may be used to inject electric current into the plurality of semiconductor structures 120 so that the plurality of semiconductor structures 120 can operate.

That is, the light-emitting device package 10 according to an embodiment may selectively operate the plurality of semiconductor structures 120 by controlling PWM signals provided to the first data line DL and the second data line SL by using the first driving unit 200 and the second driving unit 300.

The controller 400 may provide a control signal to the first driving unit 200 and the second driving unit 300. The controller 400 may determine the number of times of time-division for image data which is input in one frame and may provide a control signal corresponding to the determined number of times of time-division to the first driving unit 200 and the second driving unit 300. According to such a configuration, the light-emitting device package 10 according to an embodiment may change the number of times of time-division according to the image data.

Figure 2:
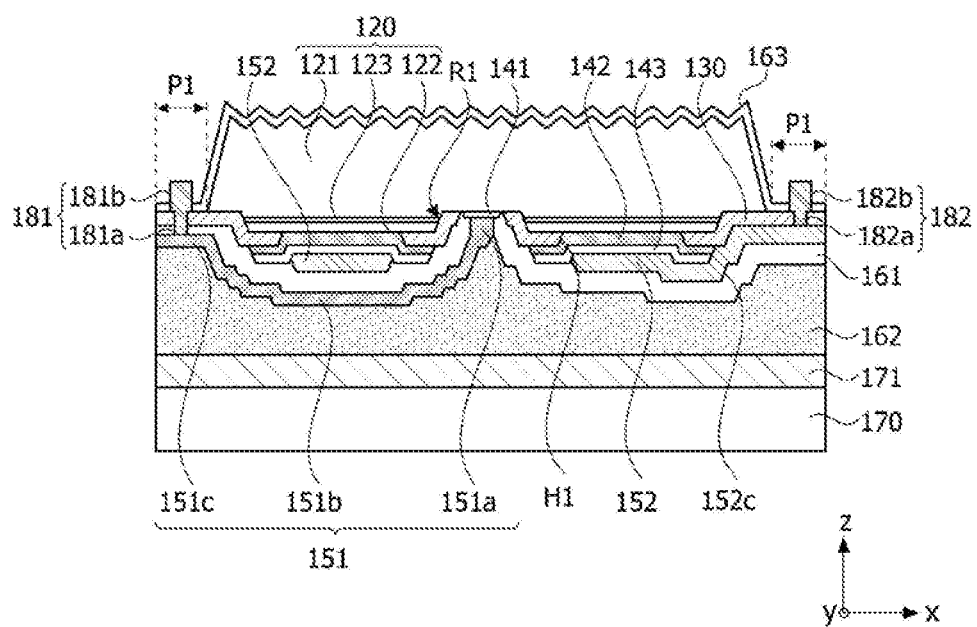
FIG. 2 is a conceptual view of a semiconductor device according to an embodiment.

FIG. 2 is a conceptual view of a semiconductor device according to an embodiment.

Referring to FIG. 2, a semiconductor device 100 according to an embodiment may include a substrate 170, a bonding layer 171, a semiconductor structure 120, a channel layer 130, a first electrode 141, a second electrode 142, a reflective layer 143, a first wiring line 151, a second wiring line 152, a first insulating layer 161, a second insulating layer 162, a passivation layer 163, a first pad 181, and a second pad 182. Also, the semiconductor structure 120 may be disposed on the substrate 170.

Figure 3:
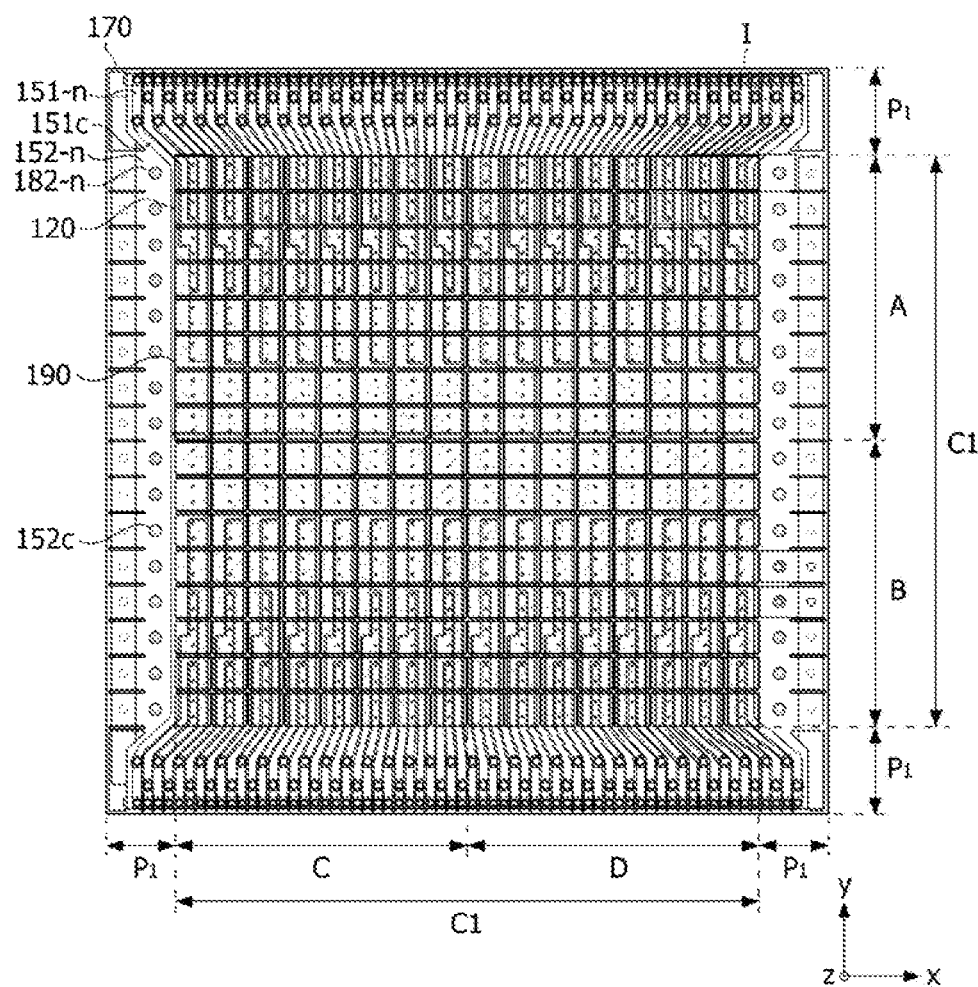
FIG. 3 is a plan view of a semiconductor device according to an embodiment.

FIG. 2 illustrates one semiconductor structure 120 disposed between the first pad 181 and the second pad 182 for convenience of description. However, substantially, as shown in FIG. 3, multiple semiconductor structures 120 (see FIG. 2) are spaced a predetermined distance apart from one another on the substrate 170, and the first pad 181 and the second pad 182 may be disposed to surround the edge of the substrate 170.

The substrate 170 may serve to support the semiconductor structure 120. The substrate 170 may contain a heat dissipation material. Accordingly, heat dissipation properties may be improved through the substrate 170. For example, the substrate 170 may contain ceramic, but the present invention is not limited thereto. In particular, since the manufacturing process, package mounting, and heat dissipation for the semiconductor device 100 are facilitated by the substrate 170, device reliability can be improved. However, the present invention is not necessarily limited thereto, and the substrate 170 may be a metal substrate formed of various materials.

The bonding layer 171 may bond the substrate 170 to the semiconductor structure 120. In other words, the semiconductor structure 120 and structures placed below the semiconductor structure 120 may be disposed above the substrate 170 by the bonding layer 171. At least one of AuSn, NiSn, AuIn, CuSn, $SiO_2$, and resin may be selected as the bonding layer 171, but the present invention is not limited thereto. For example, the bonding layer 171 may include a barrier metal or a bonding metal and, for example, may include at least one of Ti, Au, Sn, Ni, Cr, Ga, In, Bi, Cu, Ag, or Ta.

The semiconductor structure 120 may be disposed above the substrate 170. The semiconductor structure 120 may include a first conductive semiconductor layer 121, a second conductive semiconductor layer 122, and an active layer 123 disposed between the first conductive semiconductor layer 121 and the second conductive semiconductor layer 122. In the drawing, it is shown that the first conductive semiconductor layer 121 is oriented upward and the second conductive semiconductor layer 122 is oriented toward the substrate 170, but the present invention is not limited thereto.

The first conductive semiconductor layer 121 may be made of at least one selected from among compound semiconductors such as group III-V and group II-VI. The first conductive semiconductor layer 121 may be formed of a semiconductor material having an empirical formula of $In_xAl_yGa_{1-x-y}N$ ($0 \leq x \leq 1$, $0 \leq y \leq 1$, $0 \leq x+y \leq 1$) or a material selected from among AlInN, AlGaAs, GaP, GaAs, GaAsP, and AlGaInP. The first conductive semiconductor layer 121 may be doped with first dopants. The first dopants may be n-type dopants such as Si, Ge, Sn, Se, and Te. That is, the first conductive semiconductor layer 121 may be an n-type semiconductor layer doped with n-type dopants.

Meanwhile, a concave-convex structure may be formed on the first conductive semiconductor layer 121. The concave-convex structure can improve the light extraction efficiency of the semiconductor structure 120.

The second conductive semiconductor layer 122 may be made of at least one selected from among compound semiconductors such as group III-V and group II-VI. The second conductive semiconductor layer 122 may be formed of a semiconductor material having an empirical formula $In_xAl_yGa_{1-x-y}N$ ($0 \leq x \leq 1$, $0 \leq y \leq 1$, $0 \leq x+y \leq 1$) or a material selected from among AlInN, AlGaAs, GaP, GaAs, GaAsP, and AlGaInP. The second conductive semiconductor layer 122 may be doped with second dopants. The second dopants may be p-type dopants such as Mg, Zn, Ca, Sr, and Ba. That is, the second conductive semiconductor layer 122 may be a p-type semiconductor layer doped with p-type dopants.

The active layer 123 may be disposed between the first conductive semiconductor layer 121 and the second conductive semiconductor layer 122. The active layer 123 is a layer in which electrons (or holes) injected through the first conductive semiconductor layer 121 are combined with holes (or electrons) injected through the second conductive semiconductor layer 122. A transition to a lower energy level occurs due to electron-hole recombination, and thus the active layer 123 may generate light having a wavelength corresponding to the transition.

The active layer 123 may have any one of a single-well structure, a multi-well structure, a single-quantum-well structure, a multi-quantum-well (MQW) structure, a quantum dot structure, and a quantum wire structure, but the present invention is not limited thereto. When the active layer 123 is formed in a well structure, a well layer or a barrier layer of the active layer 123 may be formed in a paired structure including one or more of InGaN/GaN, InGaN/InGaN, GaN/AlGaN, InAlGaN/GaN, GaAs(InGaAs)/AlGaAs, GaP(InGaP)/AlGaP, but the present invention is not limited thereto. The well layer may be formed of a material having a smaller energy band gap smaller than the barrier layer.

Meanwhile, the semiconductor structure 120 may include a first recess R1 having a certain depth. In detail, the first recess R1 may be formed by mesa-etching the second conductive semiconductor layer 122, the active layer 123, and even a partial region of the first conductive semiconductor layer 121. Thus, a portion of the first conductive semiconductor layer 121 may be exposed. Accordingly, a first electrode 141 and a first wiring line 151 may be electrically connected to the first conductive semiconductor layer 121 through the first recess R1.

The channel layer 130 (a third insulating layer) may be disposed in a partial region below the semiconductor structure 120. Also, the channel layer 130 may be disposed to surround a lower edge of the semiconductor structure 120. Also, a portion of the channel layer 130 may be disposed below the first recess R1. Also, the channel layer 130 may be disposed between the substrate 170 and the semiconductor structure 120.

In detail, the channel layer 130 may cover the first recess R1 and also a lateral surface of the active layer 123, a portion of the first conductive semiconductor layer 121, and a portion of the second conductive semiconductor layer 122 which are exposed by the first recess R1. In this case, the channel layer 130 may be disposed such that a portion of the first conductive semiconductor layer 121 is exposed in the first recess R1. Likewise, the channel layer 130 may be disposed such that a portion of the second conductive semiconductor layer 122 is exposed.

The channel layer 130 may be disposed between adjacent semiconductor structures 120, between the semiconductor structure 120 and the first pad 181 connected to the semiconductor structure 120, and between the semiconductor structure 120 and the second pad 182 connected to the semiconductor structure 120. Also, the channel layer 130 may cover a portion of the second conductive semiconductor layer 122. For example, the channel layer 130 may expose a portion of the second conductive semiconductor layer 122 through a first hole H1.

The channel layer 130 may be made of an insulating material. In detail, the channel layer 130 may be made of an oxide or nitride which is non-conductive. For example, the channel layer 130 may be formed as one layer selected from among a silicon oxide ($SiO_2$) layer, a silicon nitride ($Si_3N_4$) layer, a titanium oxide ($TiO_x$), or an aluminum oxide ($Al_2O_3$) layer, but the present invention is not limited thereto.

The channel layer 130 may provide structural insulation between adjacent semiconductor structures 120 so that the semiconductor structures 120 can be electrically connected to each other only through the first wiring line 151 and the second wiring line 152. Also, the channel layer 130 may protect the second electrode 142, the first insulating layer 161, the second insulating layer 162, the bonding layer 171, the substrate 170, and the like disposed below the semiconductor structure 120 and the channel layer 130 from external contaminants. As a result, the channel layer 130 has improved support for the semiconductor structure 120 and can protect the semiconductor structure 120 from damage that may occur in the manufacturing process.

The first electrode 141 may be disposed below the first conductive semiconductor layer 121 and electrically connected to the first conductive semiconductor layer 121. Also, the second electrode 142 may be disposed below the second conductive semiconductor layer 122 and electrically connected to the second conductive semiconductor layer 122.

In detail, the first electrode 141 may be disposed in the first recess R1. Also, the first electrode 141 may be disposed in a region exposed by the channel layer 130 in the first recess R1.

The second electrode 142 may be disposed below the second conductive semiconductor layer 122 exposed by the channel layer 130 in the first hole H1.

The first electrode 141 and the second electrode 142 may be made of a material with electrical conductivity. Also, the first electrode 141 and the second electrode 142 may be formed of a material with high reflectivity.

For example, the first electrode 141 and the second electrode 142 may be made of a material selected from among Ti, Ru, Rh, Ir, Mg, Zn, Al, In, Ta, Pd, Co, Ni, Si, Ge, Ag, Pt, and Au or an alloy thereof.

In this case, light generated by the semiconductor structure 120 may be reflected by the first electrode 141 and the second electrode 142 and emitted upward. Accordingly, it is possible to improve the light extraction efficiency of the semiconductor structure. However, the present invention is not necessarily limited to such a material.

Also, the first electrode 141 and the second electrode 142 may contain various materials for ohmic contact.

The reflective layer 143 may be disposed below the second electrode 142. The reflective layer 143 may be made of a material with electrical conductivity. Also, the reflective layer 143 may be formed of a metal material with high reflectivity.

For example, the reflective layer 143 may be formed of a metal including at least one of Ag, Ni, Al, Rh, Pd, Ir, Ru, Mg, Zn, Pt, Cu, Au, and Hf or an alloy thereof.

Also, the reflective layer 143 may be made of the metal or alloy. For example, the reflective layer 143 may include at least one of Ag, Al, Ag—Pd—Cu alloys, or Ag—Cu alloys, but the present invention is not limited thereto.

The first insulating layer 161 may protect the elements of the semiconductor device 100 and electrically insulate adjacent elements from each other. An insulating layer with high transmittance may be used as the first insulating layer 161. For example, the first insulating layer 161 may be formed of one selected from among $SiO_2$, $Si_xO_y$, $Si_3N_4$, $Si_xN_y$, $SiO_xN_y$, $TiO_2$, $ZrO_2$, $Si_3N_4$, $Al_2O_3$, AlN, and $MgF_2$, but the present invention is not limited to such a material.

The first insulating layer 161 may cover a portion of the first electrode 141 and expose a partial region of the first electrode 141. Also, the first insulating layer 161 may be disposed below the second electrode 142, the channel layer 130, and the second wiring line 152 to cover the second electrode 142 and the channel layer 130. According to such a configuration, the first insulating layer 161 may provide electrical insulation between the first wiring line 151 and the second wiring line 152.

The second insulating layer 162 may be disposed below the first insulating layer 161 and the first wiring line 151. The second insulating layer 162 may cover the first wiring line 151 and the first insulating layer 161. According to such a configuration, the second insulating layer 162 may electrically insulate the first wiring line 151 from the outside to protect the first wiring line 151 from contaminants. As a result, the second insulating layer 162 can improve the reliability of the semiconductor device.

The passivation layer 163 may be disposed above the semiconductor device. That is, the passivation layer 163 may be disposed above the semiconductor structure 120 and on an edge region P1 of the substrate. Also, when the first conductive semiconductor layer 121 has a concave-convex structure, the passivation layer 163 disposed on the first conductive semiconductor layer 121 may have a concave-convex structure like the first conductive semiconductor layer 121.

The first wiring line 151 may be electrically connected to the first electrode 141. The second wiring line 152 may be electrically connected to the second electrode 142.

The first wiring line 151 may be electrically connected to the first electrode 141 and may extend to one side of the semiconductor structure 120 to connect to the first pad 181.

Also, the second wiring line 152 may be electrically connected to the second electrode 142 and may extend to the other side of the semiconductor structure 120 to electrically connect to the second pad 182.

The first wiring line 151 and the second wiring line 152 may be disposed on the substrate 170 to extend in different directions. For example, the extending directions of the first wiring line 151 and the second wiring line 152 may be perpendicular to each other.

The second wiring line 152 may be disposed between the semiconductor structure 120 and the substrate 170. Also, the second wiring line 152 may be disposed on the second electrode 142 and be electrically connected to the second electrode 142.

The second wiring line 152 may extend from the second electrode 142 toward an outer surface of the semiconductor structure 120. For example, the second wiring line 152 may include a second end part 152c extending to protrude further than the outer surface of the semiconductor structure 120. In other words, one end of the second wiring line 152 may be connected to the second electrode 142.

Also, the second end part 152c of the second wiring line 152 may extend from the one end of the second wiring line 152 toward the edge of the substrate 170. As a result, the second end part 152c may be electrically connected to the second pad 182, which will be described below.

The second end part 152c may extend to the edge of the substrate 170 to facilitate a connection to the second pad 182 disposed on a lateral surface of the semiconductor structure 120.

The first wiring line 151 may be disposed on the first electrode 141 and between the semiconductor structure 120 and the substrate 170. Also, the first wiring line 151 may extend from the first electrode 141 toward the edge of the semiconductor structure 120.

Also, the first wiring line 151 may include a first penetrating part 151a, a first connecting part 151b, and a first end part 151c. The first wiring line 151 may be spaced apart and insulated from the second wiring line 152 by the first insulating layer 161.

The first penetrating part 151a may pass through the active layer 123, the second conductive semiconductor layer 122, and the first insulating layer 161. Also, the first penetrating part 151a may partially pass through the first conductive semiconductor layer 121.

Also, one end of the first penetrating part 151a may be connected to the first electrode 141. The first penetrating part 151a may extend from the first electrode 141 toward the substrate 170. The other end of the first penetrating part 151a may be connected to one end of the first connecting part 151b.

The first connecting part 151b may extend from one end toward the edge of the substrate 170 along one surface of the first insulating layer 161. The other end of the first connecting part 151b may be connected to one end of the first end part 151c.

The first end part 151c may be disposed in the edge region P1 of the substrate compared to the semiconductor structure 120. Accordingly, the first wiring line 151 may be easily connected to the first pad 181 disposed on the side of the semiconductor structure 120.

The first pad 181 and the second pad 182 may be disposed on the substrate 170 and spaced apart from the semiconductor structure 120. In detail, the first pad 181 and the second pad 182 may be disposed to surround the semiconductor structure 120 on the side of the semiconductor structure 120 or on the edge of the substrate 170.

The first pad 181 may be electrically connected to the first conductive semiconductor layer 121 through the first wiring line 151 and the first electrode 141. The second pad 182 may be electrically connected to the second conductive semiconductor layer 122 through the second wiring line 152 and the second electrode 142.

The first pad 181 may include a first region 181a and a second region 181b.

The first region 181a may have one end connected to the other end of the first end part 151c. The first region 181a may pass through the first insulating layer 161, the channel layer 130, and the passivation layer 163.

The second region 181b may be disposed to protrude from the passivation layer 163. The first pad 181 may be spaced apart from the semiconductor structure 120. In particular, the first pad 181 may be spaced apart from a side surface of the semiconductor structure 120 and the passivation layer covering the side surface, but the present invention is not limited thereto.

The second pad 182 may include a first region 182a and a second region 182b.

The first region 182a may pass through the channel layer 130 and the passivation layer 163. The first region 181a may have one end connected to the other end of the second end part 152c of the second wiring line 152.

The second region 182b may have one end connected to the other end of the second end part 152c. The second region 182b may be disposed to protrude from the passivation layer 163.

Figure 4:
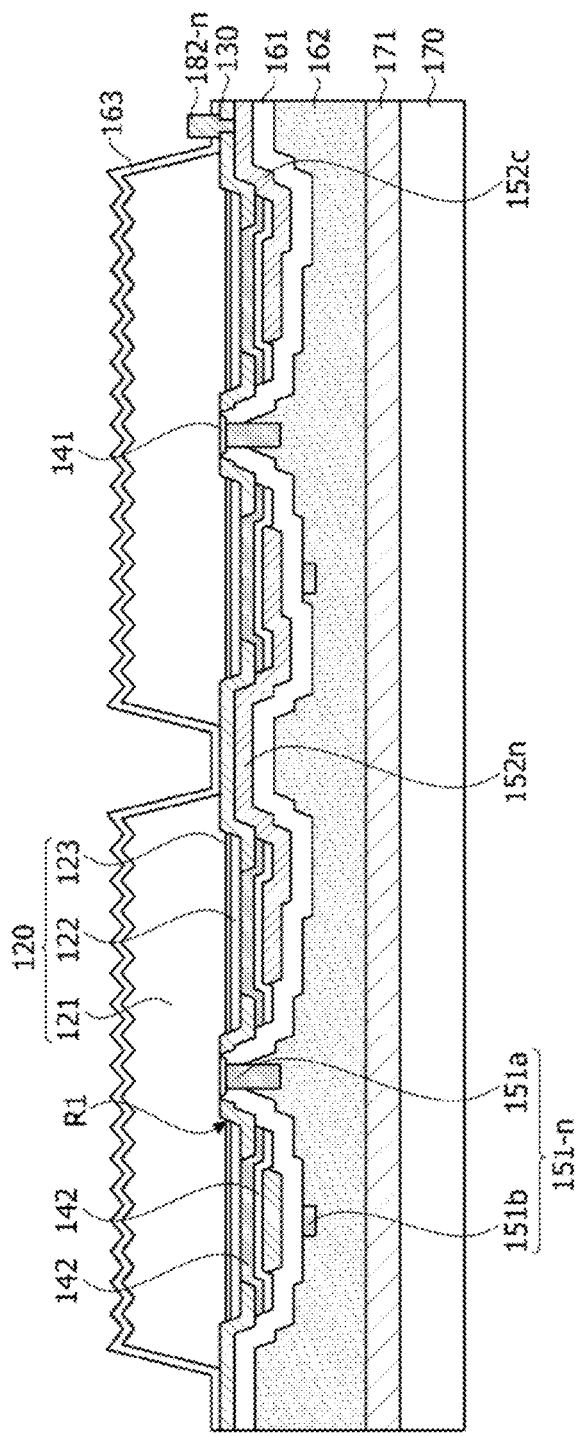
FIG. 4 is a sectional view taken along line I of FIG. 3.

FIG. 3 is a plan view of a semiconductor device according to an embodiment, FIG. 4 is a sectional view taken along I of FIG. 3, FIG. 5 is a diagram showing a first wiring line of FIG. 3, and FIG. 6 is a diagram showing a second wiring line of FIG. 3.

Referring to FIG. 3, a semiconductor device 100 according to an embodiment may include a plurality of semiconductor structures 120 disposed on one substrate 170.

In detail, the semiconductor device 100 may include the plurality of semiconductor structures 120 disposed on the substrate 170, a plurality of first wiring lines 151-*n* spaced apart from one another in a first direction (the x-direction), a plurality of second wiring lines 152-*n* spaced apart from one another in a second direction (the y-direction), a plurality of first pads 181-*n*, and a plurality of second pads 182-*n*.

The plurality of first pads 181-*n* and the plurality of second pads 182-*n* may be spaced apart from the plurality of semiconductor structures 120. The plurality of first pads 181-*n* and the plurality of second pads 182-*n* may be disposed in the edge region P1 of the substrate 170 and disposed to surround the plurality of semiconductor structures 120.

Also, the first wiring lines 151-*n* may be disposed between the semiconductor structure 120 and the plurality of first pads 181-*n* to electrically connect the first conductive semiconductor layer of the semiconductor structure 120 to the plurality of first pads 181-*n*.

Likewise, the second wiring lines 152-*n* may be disposed between the semiconductor structure 120 and the plurality of second pads 182-*n* to electrically connect the second conductive semiconductor layer of the semiconductor structure 120 to the plurality of second pads 182-*n*.

Also, the first pads 181-*n* may be disposed on the upper and lower sides of the edge region of the substrate 170 to face each other. The second pads 182-*n* may be disposed on the left and right sides of the edge region of the substrate 170 to face each other. However, the locations and arrangements of the first pads 181-*n* and the second pads 182-*n* may be changed depending on the case.

The substrate 170 may be partitioned into a central region Cl and an edge region P1. For example, the central region Cl may be the center of the substrate and may be a region where the semiconductor structure is disposed. Also, the central region Cl may have the first wiring lines 151-*n* and the second wiring lines 152-*n* disposed therein to electrically connect to the plurality of semiconductor structures.

The edge region P1, which is a region other than the central region C1, may have the plurality of first pads 181-*n* and the plurality of second pads 182-*n* disposed therein. Also, the first wiring lines 151-*n* and the second wiring lines 152-*n* may be partially disposed in the edge region P1.

As a result, the first wiring lines 151-*n* and the second wiring lines 152-*n* extend to the edge region P1 to electrically connect to the first pads 181-*n* and the second pads 182-*n*, respectively. The edge region P1 may have an overlapping region in a thickness direction.

A plurality of semiconductor structures may be spaced a predetermined distance from the center in the substrate 170 and may be configured to emit light. Here, it is shown that sixteen semiconductor structures 120 are disposed in each of traverse and longitudinal directions, but the present invention is not limited thereto. Also, the size of each of the semiconductor structures may be less than or equal to 500 μm×500 μm. That is, the width and the length of the semiconductor structure may be less than or equal to 500 μm. For example, the size of the semiconductor structure may be 300 μm×300 μm, 250 μm×250 μm, or 110 μm×110 μm. More preferably, the width and length of each of the semiconductor structures may range from 70 μm to 80 μm. However, the present invention is not limited thereto.

Also, among the plurality of semiconductor structures, first to eighth lines from the top of the substrate 170 are defined as region A, and ninth to sixteenth lines are defined as region B. Also, among the plurality of semiconductor structures, first to eighth lines from the left are defined as region C, and ninth to sixteenth lines are defined as region D.

The plurality of first wiring lines 151-*n* (n≥1) may extend to the edge region P1 of the substrate 170. In this case, one first-n wiring line 151-*n* may be electrically connected to eight semiconductor structures 120. Accordingly, 64 first wiring lines 151-*n* may be disposed on each of the upper and lower sides of the substrate 170. That is, four first-n wiring lines 151-*n* may be disposed below one semiconductor structure 120. However, this is merely an example to describe the present invention, and the present invention is not limited thereto. That is, the number of semiconductor structures 120 connected to one first-n wiring line 151-*n* and the number of first-n wiring lines 151-*n* disposed below one semiconductor structure 120 may be changed. Hereinafter, for convenience of description, the first-n wiring lines 151-*n* connected to the semiconductor structures 120 in region A may be defined as a first-1 wiring line 151-1, a first-2 wiring line 151-2, and a first-3 wiring line 151-3 in order from the left.

For example, the first-1 wiring line 151-1 may be electrically connected to eight semiconductor structures 120 disposed in the first column from the left side of region A. Here, the column may be defined to be a longitudinal line in the second direction (the y-axis direction) of the substrate 170, and the row may be defined to be a traverse line in the first direction (the x-axis direction) of the substrate 170.

A phosphor layer 190 may be disposed on the plurality of semiconductor structures 120 and the passivation layer 163 to cover the plurality of semiconductor structures 120. Thus, the phosphor layer 190 may absorb light emitted from the plurality of semiconductor structures 120, convert the light into light of a different wavelength, and then emit the light. For example, the phosphor layer 190 may emit white light.

Referring to FIGS. 5 and 6, the first-1 wiring line 151-1 may include a first-1a wiring line 151-1*a*, a first-1b wiring line 151-1*b*, a first-1c wiring line 151-1*c*, and a first-1d wiring line 151-1*d*.

Also, the first-1 wiring line 151-1 may be electrically connected to eight semiconductor structures disposed in the first column from the left side of region A. Likewise, the first-2 wiring line 151-2 may be electrically connected to eight semiconductor structures disposed in the second column on the left side of region A, and the same can be applied up to the first-32 wiring line 151-32. However, the first-17 wiring line 151-17 to the first-32 wiring line 151-32 may be electrically connected to the semiconductor structures in region C and region D.

The plurality of second wiring lines 152-*n* (n≥1) may be disposed on the left and right sides in the edge region P1 of the substrate 170. In this case, one second-n wiring line 152-*n* may be electrically connected to eight semiconductor structures.

16 second-n wiring lines 152-*n* may be disposed on each of the left and right sides of the substrate 170. That is, unlike the first-n wiring lines, one second-n wiring line 152-*n* may be disposed below one semiconductor structure 120. However, this is merely an example to describe the present invention, and the present invention is not limited thereto. That is, the number of semiconductor structures connected to one second-n wiring line 152-*n* and the number of second-n wiring lines 152-*n* disposed below one semiconductor structure may be changed.

Hereinafter, for convenience of description, the second wiring lines 152-*n* disposed on the left side of the substrate 170 may be defined as a second-1 wiring line 152-1, a second-2 wiring line 152-2, . . . , a second-16 wiring line 152-16 in order from the top. Likewise, the second wiring lines 152-*n* disposed on the right side of the substrate 170 may include a second-17 wiring line 152-17 to a second-32 wiring line 152-32 in order from the top.

The second-1 wiring line 152-1 may be electrically connected to eight semiconductor structures disposed in the first row from the top of region C. In detail, the second-1 wiring line 152-1 may be electrically connected to second conductive semiconductor layers of eight semiconductor structures disposed in the first row from the top.

Likewise, the second-2 wiring line 152-2 may be electrically connected to eight semiconductor structures disposed in the second row from the top of region C. The same may be applied up to the second-16 wiring line 152-16.

Also, the same may be applied to region D. That is, the second-n wiring lines 152-n may be electrically connected to eight semiconductor structures. For example, one second-n wiring line 152-n may be electrically connected to eight semiconductor structures in each row of region D in order from the top of the substrate 170.

In this way, each of the first-n wiring lines 151-n may be electrically connected to eight semiconductor structures in region A and region B (or region C and region D) in order from the left.

Also, the second-n wiring lines 152-n may be electrically connected to eight semiconductor structures in region C and region D in order from the top.

The plurality of first pads 181-n (n≥1) may be disposed on the upper and lower sides in the edge region P1 of the substrate 170. In this case, four first-n pads 181-n may be disposed on each of the first wiring lines 151-n. That is, a total of 128 first-n pads 181-n may be disposed on 32 first wiring lines 151-n.

For example, the first-1 pad 181-1 may include a first-1a pad 181-1a, a first-1b pad 181-1b, a first-1c pad 181-1c, and a first-1d pad 181-1d which are disposed in order from the top of the substrate 170 to the left. The first-1a pad 181-1a, the first-1b pad 181-1b, the first-1c pad 181-1c, and the first-1d pad 181-1d may be electrically connected to the first-1a wiring line 151-1a, the first-1b wiring line 151-1b, the first-1c wiring line 151-1c, and the first-1d wiring line 151-1d, respectively.

Also, the first-1a wiring line 151-1a, the first-1b wiring line 151-1b, the first-1c wiring line 151-1c, and the first-1d wiring line 151-1d may be electrically connected to first conductive semiconductor layers of two adjacent semiconductor structures among the eight semiconductor structures.

Also, the plurality of first-n pads 181-n may be defined as a first-1 pad 181-1, a first-2 pad 181-2, . . . , a first-16 pad 181-16 in order from the left on the top of the substrate. Also, the plurality of first-n pads 181-n may be defined as a first-17 pad 181-17 and a first-32 pad 181-32 in order from the left on the bottom of the substrate.

Accordingly, the first-1 pad 181-1 to the first-16 pad 181-16 may be electrically connected to the first-1 wiring line 151-1 to the first-16 wiring line 151-16 which are disposed in region A.

Also, the first-17 pad 181-17 to the first-32 pad 181-32 may be electrically connected to the first-17 wiring line 151-17 to the first-32 wiring line 151-32 which are disposed in region B.

The plurality of second pads 182-n (n≥1) may be disposed on the edge region P1 of the substrate 170. In this case, one second-n pad 182-n may be disposed on each of the second-n wiring line 152-n. As described above, 16 second-n pads 182-n may be disposed on each of the left and right sides of the substrate 170. Also, one second-n pad 182-n may be electrically connected to eight semiconductor structures in the same row. However, this is merely an example to describe the present invention, and the present invention is not limited thereto.

First, the second-n pads 182-n disposed on the left side of the substrate 170 may be defined as a second-1 pad 182-1, a second-2 pad 182-2, . . . , a second-16 pad 182-16 in order from the top. Here, the second-1 pad 182-1 may be disposed on and electrically connected to the second-1 wiring line 152-1. Also, the second-1 pad 182-1 may be electrically connected to eight semiconductor structures disposed in the first line from the top in region C. The same may be applied up to the second-16 pad 182-16. Also, this may be applied to the second pads 182-17 to 182-32 disposed on the right side of the substrate 170 in the same way.

As described above, the plurality of first pads 181-n and second pads 182-n may be disposed along the edge region P1 of the substrate 170. Also, the plurality of semiconductor structures may be disposed inside the plurality of pads 181-n and 182-n. That is, the plurality of first pads 181-n and second pads 182-n may be disposed to surround the plurality of semiconductor structures. In addition, the plurality of first wiring lines 151-n and second wiring lines 152-n may extend from the first and second conductive semiconductor layers 121 and 122 or the first and second electrodes 141 and 142 to the edge region of the substrate to connect to the plurality of pads 181-n and 182-n. The plurality of semiconductor structures are formed not individually but by growing the first and second conductive semiconductor layers 121 and 122 and the active layer 123 all at once and isolating the layers in units of one chip (device) through etching. Accordingly, it is possible to increase a light-emitting region while improving processability.

FIGS. 7 and 8 are diagrams illustrating a manual matrix driving scheme according to an embodiment.

Referring to FIGS. 7 and 8, a first driving unit may apply a first control signal to a selected data line DL. Also, a second driving unit may apply a second control signal to a scan line SL.

As shown in FIG. 7, a plurality of semiconductor structures 120 may include a display region DP. Also, as described above, the display region DP may include pixels PX, each of which is a semiconductor structure 120.

In this case, the display region DP may be partitioned into a plurality of divisional display regions DP1 and DP2 according to the number of times of time-division due to the scan line SL. Also, each of the divisional display regions DP1 and DP2 may include the same number of scan lines as the number of times of time-division corresponding to the structure of the semiconductor device 100. Here, the number of times of time-division corresponding to the structure of the semiconductor device 100 may be the number of semiconductor structures connected to one data line DL. Accordingly, the scan line SL may include one group scan line assigned for the same number of scan lines as the number of times of time-division. For example, for two-time-division, a first group scan line may include a first scan line and a second scan line SL.

Also, a second control signal may be applied to the scan lines SL in the divisional display regions DP1 and DP2 in different time periods during one frame FR. Here, one frame FR refers to a cycle in which image data is displayed through the display region DP. Generally, one frame FR is 60 Hz or 1/60 s. However, the present invention is not limited to such a frequency, and the frame may be changed variously depending on the light-emitting device package.

In the case of two-time-division, each of the first divisional display region DP1 and the second divisional display region DP2 may include two scan lines SL. For example, the first divisional display region DP1 may include a first scan line SL1 and a second scan line SL2, and the second divisional display region DP2 may include a third scan line SL3 and a fourth scan line SL4.

In this case, the second control signal may be applied to one scan line in the first divisional display region DP1 and one scan line in the second divisional display region DP2 in a first time period during one frame FR.

Also, the second control signal may be applied to the other scan line in the first divisional display region DP1 and the other scan line in the second divisional display region DP2 in a second time period (e.g., a time period other than the first time period in one frame FR in the case of two-time-division) during one frame FR.

Also, when the second control signal is applied to one scan line in the first divisional display region DP1, the same second control signal may be applied to one scan line in the second divisional display region DP2. That is, the second control signal may be applied to each of the plurality of divisional display regions DP through one scan line in every time period.

Also, the second control signal may be sequentially applied to the scan lines of the divisional display regions DP. For example, the second control signal may be applied to the first scan line SL1 and the third scan line SL3 of the first group scan line GSL1 in the first time period, and the second control signal may be applied to the second scan line SL2 and the fourth scan line SL4 of the second group scan line GSL2 in the second time period. The same may be applied to other group scan lines.

However, the present invention is not limited to such a sequential scheme, and the second control signal may be applied to the first scan line SL1 and the fourth scan line SL4 in the first time period and may be applied to the second scan line SL2 and the third scan line SL3 in the second time period.

According to such a configuration, the light-emitting device package according to an embodiment may display image data applied by a passive matrix scheme, through the semiconductor structure.

Also, as described above, the numbers of scan lines SL, data lines DL, and display regions DP may be changed depending on the number of semiconductor structures 120 of the semiconductor device or depending on the number of times of time-division.

FIG. 9 is a diagram illustrating the effect of a light-emitting device package according to an embodiment.

Referring to FIG. 9, luminous flux (y-axis) corresponding to the average current (x-axis) injected into the semiconductor structure in the case of (a) two-time-division and (b) four-time-division is shown. Here, the average current injected into the semiconductor device in the case of (a) two-time-division may be equal to that in the case of (b) four-time-division, and the peak current in the case of (a) two-time-division may be ½ of that in (b) four-time-division.

Electric current is injected into one scan line in one time period among four time periods during one frame in the case of (a) two-time-division and (b) four-time-division. However, since electric current is injected in one time period between two time periods during one frame in the case of (b) four-time-division, the peak current per scan line in the case of (a) two-time-division may be two times that in the case of (a) two-time-division.

As a result, it can be seen that in the case of four-time-division, luminous flux does not increase in proportion to the average current even when the same average current is injected as in the case of two-time-division. This is because current spreading does not increase linearly even when a high peak current is injected.

Accordingly, it is possible to increase the luminous flux by decreasing the number of times of time-division as necessary. Alternatively, necessary information may be displayed on a road surface by increasing the number of times of time-division as necessary.

FIG. 10 is a conceptual view of a light-emitting device package according to another embodiment of the present invention, FIG. 11 is a first modification of the semiconductor structure, FIG. 12 is a second modification of the semiconductor structure.

Referring to FIG. 10, a light-emitting device package according to an embodiment may include a semiconductor device 100, a first driving unit 200, a second driving unit 300, and a controller 400.

The semiconductor device 100 may include semiconductor structures 120 spaced apart from one another in a central region Cl of a substrate 170 in a first direction (X-axis direction) and in a second direction (Y-axis direction) perpendicular to the first direction, a plurality of first wiring lines 151 electrically connected to the semiconductor structures 120 and spaced apart from one another in the first direction, and a plurality of second wiring lines 152 electrically connected to the semiconductor structures 120 and spaced apart from one another in the second direction.

The first driving unit 200 may be connected to the plurality of first wiring lines 151 to output a first control signal, and the second driving unit 300 may be connected to the plurality of second wiring lines 152 to output a second control signal.

All of the foregoing descriptions may be applied to the basic structure, the time-division control method, and the like of the light-emitting device package. However, this embodiment has additional features in that the size and number of semiconductor structures are different for each region and in that time-division control is independently performed on the semiconductor structures different in size and number.

A plurality of first semiconductor structures 120A may be disposed in a first region CA1 of the substrate 170. Also, a plurality of second semiconductor structures 120B may be disposed in a second region CA2 of the substrate 170. The first region CA1 and the second region CA2 may be disposed in a central region Cl of the substrate 170. The first region CA1 and the second region CA2 may have the same area, but the present invention is not limited thereto.

The size of the plurality of first semiconductor structures 120A may be different from the size of the plurality of second semiconductor structures 120B. According to such a structure, there is an advantage in that various functions may be implemented together in one light-emitting device package by manufacturing semiconductor structures of different sizes depending on a region that requires relatively high resolution or a region that does not require high resolution.

The size of the semiconductor structure may refer to a shape as well as an area. For example, the first semiconductor structures 120A disposed in the first region CA1 may have a square shape which has a width and a length which are equal to each other, and the second semiconductor structures 120B disposed in the second region CA2 may have a rectangle shape which has a width and a length which are different from each other. Since the semiconductor structures have different sizes, it is possible to improve visibility. In this case, the size of the first semiconductor structures 120A may be the same as the size of the second semiconductor structures 120B.

According to an embodiment, the number of first semiconductor structures 120A in the first region CA1 may be the same as the number of second semiconductor structures 120B in the second region CA2, but the present invention is not limited thereto.

The controller 400 may perform time-division control on the first semiconductor structures 120A of the first region CA1 and the second semiconductor structures 120B of the second region CA2 independently.

For example, the controller 400 may perform four-time-division on the first region CA1 and may perform two-time-division on the second region CA2. Accordingly, when the first semiconductor structures 120A of the first region CA1 are disposed in four lines and the second semiconductor structures 120B of the second region CA2 are disposed in four lines, the second semiconductor structures 120B may be alternately lit by two lines, and the first semiconductor structures 120A may be sequentially lit by one line.

However, the present invention is not limited thereto, and the number of times of time-division and the time-division method for the first region CA1 and the second region CA2 may be variously modified according to the chip size and the driving purpose. In this case, the structure of the first wiring electrode and the second wiring line may be variously modified according to the number of times of time-division.

Referring to FIG. 11, the semiconductor structure may include a plurality of first semiconductor structures 120A disposed in the first region CA1, semiconductor structures 120B disposed in the second region CA2, and semiconductor structures 120C disposed in the third region CA3.

According to an embodiment, three semiconductor structures of different sizes may be disposed. In this case, first semiconductor structures 120A, second semiconductor structures 120B, and third semiconductor structures 120C may be produced differently in number and size. For example, the number of first semiconductor structures 120A may be 8×16, and the number of second semiconductor structures 120B and the number of third semiconductor structures 120C may be 2×32. However, the present invention is not limited thereto, and the number and shapes of semiconductor structures may vary depending on the purpose.

Referring to FIG. 12, the size of the first semiconductor structure 120A in the first region CA1 may be less than the size of the second semiconductor structure 120B in the second region CA2. For example, the first semiconductor structure 120A may have a rectangular shape in which the length in the traverse direction (X-axis direction) is greater than the length in the longitudinal direction (Y-axis direction), and the second semiconductor structure 120B may have a rectangular shape in which the length in the traverse direction is less than the length in the longitudinal direction.

It may be advantageous that the first semiconductor structure 120A is elongated in the traverse direction to display information on a road surface and that the second semiconductor structure 120B is elongated in the longitudinal direction to secure forward visibility and prevent dazzling. However, the present invention is not limited thereto, and the shapes of semiconductor structures may be variously modified as necessary.

FIG. 13 is a diagram showing a field of view (FOV) of a headlamp, and FIG. 14 is a third modification of the semiconductor structure.

Referring to FIG. 13, the FOV of a high beam (HB) of a smart headlamp may be divided into an upper region HB12 and a lower region HB11. A high-beam (HB) region may partially overlap with a low-beam (LB) region. The upper region HB12 of the high beam may be a region for emitting light forward so that a driver can check a forward situation. Accordingly, the upper region HB12 requires high brightness but may not require high resolution. Conversely, the lower region HB11 may be a region for displaying information SG1 such as text or images on a road surface. Accordingly, the lower region HB11 does not require high brightness but may require high resolution.

Therefore, referring to FIG. 14, the first region CA1 for emitting light to the lower region HB11 of the high beam may be produced such that there are a smaller number of first semiconductor structures 120A with a smaller size. Thus, high resolution is possible, and various information SG1 can be displayed on a road surface. Also, time-division control can be independently performed so that the information display is possible. The controller 400 may receive information to be displayed and may determine the number of times of time-division for the first region CA1.

Also, since the second region CA2 for emitting light to the upper region HB12 of the high beam needs a function of securing visibility and preventing dazzling, the number of second semiconductor structures 120B may be smaller than the number of first semiconductor structures 120A. Also, the size of the second semiconductor structures 120B may be greater than the size of the second semiconductor structures 120A. The controller 400 may determine the number of times of time-division for the second region CA2 independently of the time-division control for the first region CA1. When there is no information to be displayed on a road surface, the number of times of time-division for the first region CA1 may be the same as the number of times of time-division for the second region CA2.

The second region CA2 may block light emitted from a vehicle on an adjacent lane to reduce irradiated to the vehicle in the adjacent lane to prevent dazzling. That is, by turning off a semiconductor structure that emits light to a vehicle on a neighboring lane, a blocking region HB13 (see FIG. 13) may be formed to prevent dazzling. In this case, in order to improve visibility and prevent dazzling, the second semiconductor structure 120B may be elongated in the longitudinal direction, but the present invention is not limited thereto.

The controller 400 may perform time-division control on the first semiconductor structures 120A of the first region CA1 and the second semiconductor structures 120B of the second region CA2 independently.

For example, the controller 400 may perform four-time-division on the first region CA1 and may perform two-time-division on the second region CA2. Accordingly, when the first semiconductor structures 120A of the first region CA1 are disposed in four lines and the second semiconductor structures 120B of the second region CA2 are disposed in four lines, the second semiconductor structures 120B may be alternately lit by two lines, and the first semiconductor structures 120A may be sequentially lit by one line.

However, the present invention is not limited thereto, and the number of times of time-division and the time-division method for the first region CA1 and the second region CA2 may be variously modified according to the chip size and the driving purpose. In this case, the structure of the first wiring electrode and the second wiring line may be variously modified according to the number of times of time-division.

FIG. 15 is a fourth modification of the semiconductor structure, FIG. 16 is a diagram showing an FOV covered by the semiconductor structure of FIG. 15, and FIG. 17 is a fifth modification of the semiconductor structure.

Referring to FIG. 15, the number of first semiconductor structures 120A and the number of second semiconductor structures 120B may be increased. In this case, it is possible to increase the size of the semiconductor device. Referring to FIG. 16, the semiconductor structure of FIG. 15 may cover a region HB11 covered by a high beam of a vehicle and a region HB12 covered by a low beam of the vehicle. That is, one light-emitting device package may serve as both of the low beam and the high beam.

Referring to FIG. 17, the second region CA2 may be disposed to surround the first region CA1. That is, a part corresponding to the first region CA1 may function to display information on a road surface, and the second region CA2 may function to secure visibility by emitting light around the first region CA1. However, the present invention is not limited thereto, and the first region CA1 may be disposed on a corner of the entire region of the semiconductor structure.

Figure 18A:
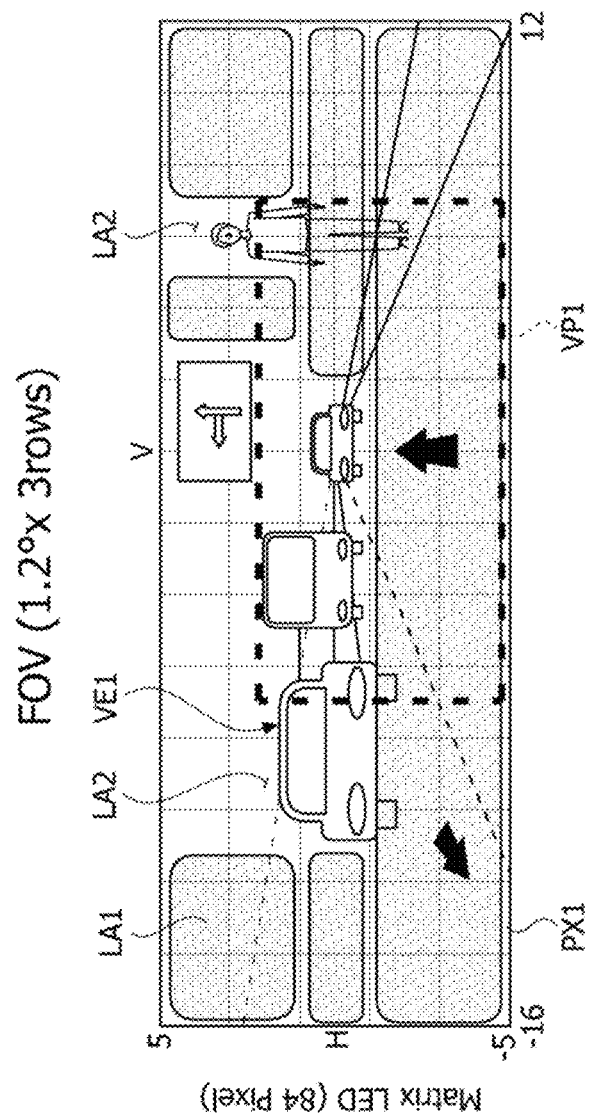
FIG. 18A is a diagram showing an FOV of a conventional matrix headlamp.
Figure 18B:
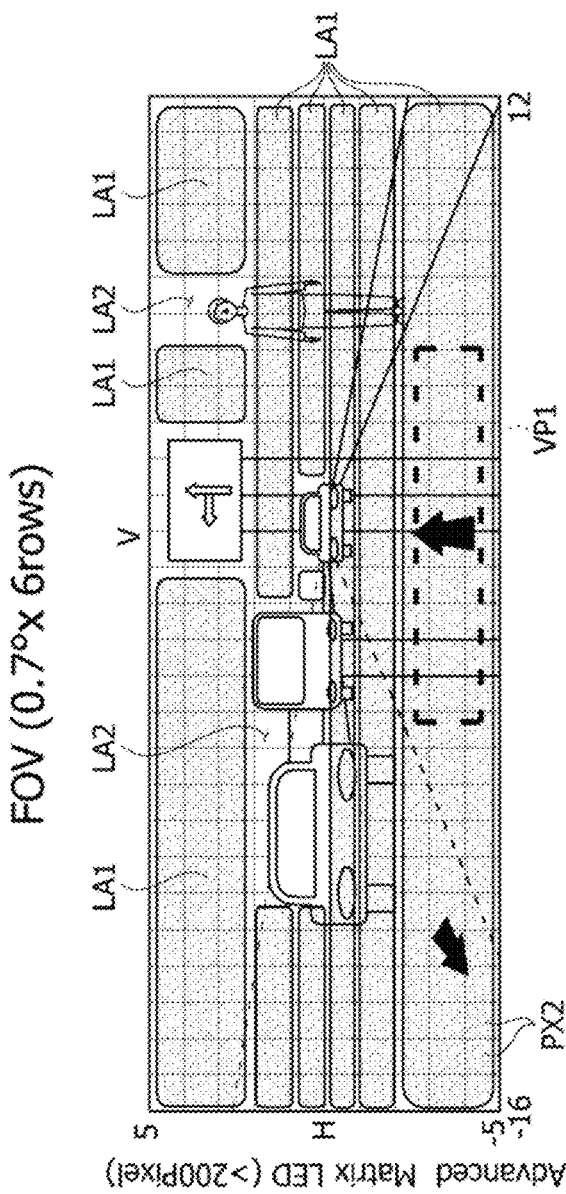
FIG. 18B is a diagram showing an FOV of a matrix headlamp according to an embodiment.

FIG. 18A is a diagram showing an FOV of a conventional matrix headlamp, and FIG. 18B is a diagram showing an FOV of a matrix headlamp according to an embodiment.

Referring to FIG. 18A, the conventional matrix headlamp has a small number of large pixels PX1 and thus has low resolution. For example, the number of pixels of the conventional matrix headlamp may be equal to or less than about 80.

Thus, a region LA1 to which light is to be emitted and a region LA2 to which no light is to be emitted cannot be precisely controlled, and for dimming control to prevent dazzling, visibility to vehicles ahead is greatly reduced. As a result, a digital light processing (DLP) module with high resolution should cover the entirety of a front region VP1.

Accordingly, since the FOV of the DLP module is increased, system complexity and manufacturing costs increase. The DLP module may be implemented with about 20,000 or more pixels and may include a high-resolution device such as a digital micro-minor device (DMD) or MEMS scanner.

Referring to FIG. 18B, the matrix headlamp according to an embodiment has a large number of small pixels PX2 and thus has relatively high resolution. For example, the number of pixels of the matrix headlamp according to an embodiment may be equal to or greater than 200. Thus, a region LA1 to which light is to be emitted and a region LA2 to which no light is to be emitted can be precisely controlled, and thus it is possible to sufficiently secure visibility to vehicles ahead even upon dimming control.

Accordingly, even in the case of combining with a DLP module in order to display information (numbers, text, etc.) on a road surface, the FOV of the DLP module needs to cover only a region VP1 where the information display is to be output, thereby simplifying the system and reducing the manufacturing costs. That is, the FOV of the LDP module may have a horizontal degree (H) ranging between 0 degrees and −5 degrees. In this case, a horizontal angle of 0 degrees means that the FOV is coplanar with the optical axis of light emitted from the light-emitting device package.

FIG. 19 is a conceptual view showing a structure in which semiconductor structures of a headlamp are connected in series according to an embodiment, FIG. 20 is a plan view showing a structure in which semiconductor structures of a headlamp are connected in series according to an embodiment, and FIG. 21 is a conventional view showing a structure in which semiconductor structures of a headlamp are connected in series or in parallel according to an embodiment.

Referring to FIG. 19, the semiconductor structures of the headlamp according to an embodiment may be connected in series. For the sake of understanding, a diode symbol is marked inside each semiconductor structure.

When voltage control is performed on a semiconductor structure according to the number of times of time-division, a surplus voltage may be generated. The surplus voltage may cause heat to be generated in a driving unit. Therefore, according to an embodiment, it is possible to reduce heat generation of the driving unit by connecting the semiconductor structures in series and then performing electric-current driving in at least one section. In addition, it is also possible to perform electric-current control due to various advantages other than the above-listed reasons.

The semiconductor structures may include a plurality of first semiconductors 120A with a relatively small size and a plurality of semiconductor structures 120B with a relatively large size which are disposed in the first direction (x-axis direction). For example, the second semiconductor structures 120B may be connected in series in the first row L1 and the sixth row L6 in the first direction, and the first semiconductor structures 120A may be connected in series in the second to fifth rows L2, L3, L4, and L5 in the first direction. At this time, a bypass switch (not shown) is disposed on each wiring line so that electric current may not be selectively applied to a semiconductor structure that is not lit in the same row.

Relatively low current may be applied to the first semiconductor structures 120A with a relatively small size, and relatively high current may be applied to the second semiconductor structures 120B with a relatively large size. For example, a current of 125 mA may be applied to the second row where the first semiconductor structures 120A are disposed, and a current of 1.0 A may be applied to the first row L1 where the semiconductor structures 120B are disposed. However, the present invention is not limited thereto.

The same level of current is applied to a plurality of semiconductor structures disposed in the same row, but the plurality of semiconductor structures may have different brightness through pulse width modulation (PWM) control. For example, the pulse width may be controlled such that the brightness increases at a central portion of the headlamp where an x-axis and a y-axis intersect.

Referring to FIG. 20, semiconductor structures may be electrically connected to each other by a connection electrode. That is, an N-type semiconductor layer of one semiconductor structure and a P-type semiconductor layer of a neighboring semiconductor structure may be sequentially connected in series.

For example, a second connection electrode 1011 may be disposed between adjacent second semiconductor structures 120B, and the second connection electrode 1011 may be electrically connected to an N-type semiconductor layer or a P-type semiconductor layer of the second semiconductor structure 120B by a through-hole 1012.

Likewise, a first connection electrode 1013 may be disposed between adjacent first semiconductor structures 120A and may be electrically connected to an N-type semiconductor layer or a P-type semiconductor layer of the first semiconductor structure 120A by a through-hole 1014.

In detail, the first connection electrode 1013 may be electrically connected to a first conductive semiconductor layer (an N-type semiconductor layer) of one adjacent first semiconductor structure 120A-1 by a first through-hole 1014 and electrically connected to a second conductive semiconductor layer (a P-type semiconductor layer) of the other adjacent first semiconductor structure 120A-2 by a second through-hole 1015 to connect the first semiconductor structures in series.

In this case, the first connection electrode 1013 may be exposed to the outside of the semiconductor structure of the plurality of first wiring lines 151 and the second wiring lines 152 and may be electrically connected to the driving unit. That is, a structure in which first wiring lines and second wiring lines are integrally formed with a semiconductor structure is the same as that described with reference to FIGS. 2 to 4 but is different in that semiconductor structures are connected in series rather than in parallel.

Referring to FIG. 21, the semiconductor structures may have a structure in which serial and parallel connections are mixed. A region that does not require time division may be connected in series, and a region that requires time division may be connected in parallel. For example, the second semiconductor structures 120B in the first row L1 and the first semiconductor structures 120a in the second row L2 and the third row L3 may be connected in series, and the first semiconductor structures 120A in the fourth to ninth rows L4 to L9 may be connected in parallel. Here, two-time-division in which the first semiconductor structures 120A in the fourth row L4 and the first semiconductor structures 120A in the fifth row L5 are connected in parallel is illustrated. However, the present invention is not limited thereto, and the parallel structure may be variously modified according to the number of times of time-division.

FIG. 22 is a diagram showing a lamp structure in which a light-emitting device package is combined with an optical system.

Referring to FIG. 22, the light-emitting device package according to an embodiment may perform a headlamp function using one optical system 50 because a plurality of semiconductor structures 120 are disposed on one substrate 170. Also, the light-emitting device package 10 according to an embodiment may allow the sizes and number of semiconductor structures to be variously adjusted. On the other hand, a conventional semiconductor package implements a headlamp by arranging a plurality of modules with 10 or fewer semiconductor chips and thus disadvantageously requires a plurality of optical systems.

FIG. 23 is a conceptual view of a light-emitting device package according to an embodiment of the present invention, FIG. 24 is a conceptual view of a light-emitting device package according to another embodiment of the present invention, and FIG. 25 is a conceptual view of a light-emitting device package according to still another embodiment of the present invention.

Referring to FIG. 23, the light-emitting device package according to an embodiment may include a circuit board 20, a driving unit 30, and a semiconductor device 100.

The circuit board 20 is not particularly limited. The circuit board 20 may include a plurality of pads 21 electrically connected to the driving unit 30. The circuit board 20 may contain ceramic, but the present invention is not limited thereto. When a circuit board is made of ceramic, the board facilitates heat dissipation, and thus the reliability of the device can be improved. However, the present invention is not limited thereto, and the circuit board 20 may be a board made of various materials.

The driving unit 30 may be disposed on the circuit board 20. The driving unit 30 may be electrically connected to the semiconductor device 100 by a plurality of wires W1. That is, the plurality of wires W1 may become a plurality of data lines. The driving unit 30 may control a PWM signal provided through the plurality of data lines to selectively operate the plurality of semiconductor structures 120. The driving unit 30 may serve as the first driving unit and the second driving unit of FIG. 1.

As described above, the semiconductor device 100 may generate a large amount of heat while a plurality of semiconductor structures 120 are being dimmed. In addition, the driving unit 30 may also generate a large amount of heat during a signal processing process. Accordingly, the heat may be concentrated on a central region of the circuit board 20 where the driving unit 30 and the semiconductor device 100 are disposed. As a result, the heat generated in the semiconductor structure 120 cannot be quickly dissipated. Also, the heat generated in the driving unit 30 may degrade the reliability of the semiconductor structure 120. Also, an increase in chip size may lead to defects due to thickness variations.

Referring to FIG. 24, the driving unit 30 may include a first driving unit 30A disposed on one side of the semiconductor device 100 on the circuit board 20 and a second driving unit 30B disposed on the other side of the semiconductor device 100 on the circuit board 20.

The first driving unit 30A and the first driving unit 30A may be electrically connected to the semiconductor device 100 by a plurality of wires W1. The number of wires may correspond to the number of signal lines. However, the present invention is not limited thereto, and a driving unit may be electrically connected to a circuit board by various mounting methods such as flip bonding.

The first driving unit 30A may control the dimming of semiconductor structures 120 disposed on the left side of the semiconductor device 100, and the first driving unit 30A may control the dimming of the semiconductor structures disposed on the right side of the semiconductor device 100. However, the present invention is not limited thereto, and the first driving unit 30A and the second driving unit 30B may perform dimming control on the entirety of the semiconductor structure 120 together. For example, the driving unit may be a complementary metal-oxide semiconductor (CMOS) driving unit, but the present invention is not limited thereto.

According to such a configuration, the semiconductor device 100 is directly disposed on the circuit board 20, and thus it is possible to improve heat dissipation performance. Also, the first driving unit 30A and the second driving unit 30B are disposed on the circuit board 20 in a distributed manner, and thus it is possible to improve heat dissipation performance. Furthermore, heat generated in the first driving unit 30A and the second driving unit 30B is quickly dissipated, and thus it is possible to prevent the reliability of the semiconductor structure 120 from being degraded by the heat applied from the driving unit.

The number of driving units is not particularly limited. The number of driving units may be three or four, and the driving unit may be divided into a plurality of driving units depending on various issues.

A molding member 40 may be disposed on the circuit board 20 to cover the first and second driving units 30A and 30B. The molding member 40 may expose a light exit surface ES1 of the semiconductor structure 120. The material of the molding member 40 is not particularly limited. That is, various materials capable of protecting the driving unit 30 and the wires W1 may be selected for the molding member 40. For example, the molding member 40 may be made of a polymer material such as white silicone. Referring to FIG. 25, the circuit board 20 may include recesses 22 for accommodating the first driving unit 30A and the second driving unit 30B.

The above-described semiconductor device and light-emitting device package may be used as various light sources other than the above-described headlamp. For example, the semiconductor device and light-emitting device package may be used as a light source of an image display device or a light source of a lighting device.

The semiconductor device and the light-emitting device package may be used as an edge-type backlight unit or a direct-type backlight unit when the semiconductor device and the light-emitting device package are used as a backlight unit of an image display device and may be used as a lamp or a bulb when the semiconductor device and the light-emitting device package are used as a light source of a lighting device.

While the present invention has been described with reference to exemplary embodiments, these are just examples and do not limit the present invention. It will be understood by those skilled in the art that various modifications and applications may be made therein without departing from the essential characteristics of the embodiments. For example, elements described in the embodiments above in detail may be modified and implemented. Furthermore, differences associated with such modifications and applications should be construed as being included in the scope of the present invention defined by the appended claims.

The invention claimed is:

1. A semiconductor device comprising:
a substrate;
a plurality of semiconductor structures arranged in a matrix form and in a central region of the substrate;
a passivation layer disposed on upper surfaces and lateral surfaces of the semiconductor structures and in an edge region of the substrate;
a plurality of first wiring lines disposed below and electrically connected to the plurality of semiconductor structures, the first wiring lines comprising first end parts extending from the central region to the edge region of the substrate;
a plurality of second wiring lines disposed below and electrically connected to the plurality of semiconductor structures, the second wiring lines comprising second end parts extending from the central region to the edge region of the substrate;
a plurality of first pads connected to the plurality of first end parts through the passivation layer; and
a plurality of second pads connected to the plurality of second end parts through the passivation layer,
wherein
the plurality of semiconductor structures include a plurality of first semiconductor structures disposed in a first region of the central region and a plurality of second semiconductor structures disposed in a second region of the central region, and
the plurality of first semiconductor structures have a different size from the plurality of second semiconductor structures.

2. The semiconductor device of claim 1, wherein
the plurality of semiconductor structures are spaced apart from one another in a first direction and a second direction perpendicular to the first direction,
the plurality of first wiring lines are spaced apart from one another in the first direction, and
the plurality of second wiring lines are spaced apart from one another in the second direction.

3. The semiconductor device of claim 2, wherein the first region is equal in area to the second region.

4. The semiconductor device of claim 3, wherein the number of first semiconductor structures disposed in the first region is greater than the number of second semiconductor structures disposed in the second region.

5. The semiconductor device of claim 2, wherein a width, in the second direction, of each of the first semiconductor structures disposed in the first region is smaller than a width, in the second direction, of each of the second semiconductor structures disposed in the second region.

6. The semiconductor device of claim 5, wherein a width of the second semiconductor structures in the first direction is smaller than a width of the first semiconductor structures in the first direction.

7. The semiconductor device of claim 2, wherein the first region and the second region are disposed in the second direction.

8. The semiconductor device of claim 2, further comprising a connection electrode configured to electrically connect the semiconductor structures disposed in the first direction among the plurality of semiconductor structures,
wherein
the first wiring lines and the second wiring lines extend from the central region to the edge region of the substrate, and
the connection electrode electrically connects a first conductive semiconductor layer of one semiconductor structure to a second conductive semiconductor layer of an adjacent semiconductor structure.

9. A light-emitting device package comprising:
a circuit board;
a semiconductor device disposed on the circuit board;
a driving unit disposed on the circuit board and spaced apart from the semiconductor device;
a plurality of wires configured to connect the semiconductor device to the driving unit; and
a molding member disposed on the circuit board to cover the driving unit,
wherein
the semiconductor device comprises:
a substrate;
a plurality of semiconductor structures arranged in a matrix form and in a central region of the substrate;
a passivation layer disposed on upper and lateral surfaces of the semiconductor structures and in an edge region of the substrate;
a plurality of first wiring lines disposed below and electrically connected to the plurality of semiconductor structures, the first wiring lines comprising first end parts extending from the central region to the edge region of the substrate;
a plurality of second wiring lines disposed below and electrically connected to the plurality of semiconductor structures, the second wiring lines comprising second end parts extending from the central region to the edge region of the substrate;
a plurality of first pads connected to the plurality of first end parts through the passivation layer; and
a plurality of second pads connected to the plurality of second end parts through the passivation layer,
the plurality of semiconductor structures include a plurality of first semiconductor structures disposed in a first region of the central region and a plurality of second semiconductor structures disposed in a second region of the central region, the plurality of first semiconductor structures have a different size from the plurality of second semiconductor structures, and the plurality of wires electrically connect the plurality of first pads and the plurality of second pads to the driving unit.

10. The light-emitting device package of claim 9, wherein the driving unit comprises:

a first driving unit disposed on one side of the semiconductor device on the circuit board; and a second driving unit disposed on the other side of the semiconductor device on the circuit board.

11. The light-emitting device package of claim 9, wherein the circuit board comprises recesses for accommodating the first driving unit and the second driving unit.

12. The light-emitting device package of claim 9, further comprising a molding member configured to cover the first driving unit and the second driving unit.

13. The light-emitting device package of claim 9, wherein the plurality of semiconductor structures are spaced apart from one another in a first direction and a second direction perpendicular to the first direction, wherein the plurality of first wiring lines are spaced apart from one another in the first direction, and wherein the plurality of second wiring lines are spaced apart from one another in the second direction.

14. The light-emitting device package of claim 13, wherein the first region is equal in area to the second region.

15. The light-emitting device package of claim 14, wherein the number of the first semiconductor structures disposed in the first region is greater than the number of the second semiconductor structures disposed in the second region.

16. The light-emitting device package of claim 13, wherein a width, in the second direction, of each of the first semiconductor structures disposed in the first region is smaller than a width, in the second direction, of each of the second semiconductor structures disposed in the second region.

17. The light-emitting device package of claim 16, wherein a width of the second semiconductor structures in the first direction is smaller than a width of the first semiconductor structures in the first direction.

18. The light-emitting device package of claim 13, wherein the first region and the second region are disposed in the second direction.

19. The light-emitting device package of claim 14, further comprising a connection electrode configured to electrically connect the semiconductor structures disposed in the first direction among the plurality of semiconductor structures.

20. The light-emitting device package of claim 19, wherein the first wiring lines and the second wiring lines extend from the central region to the edge region of the substrate, and wherein the connection electrode electrically connects a first conductive semiconductor layer of one semiconductor structure to a second conductive semiconductor layer of an adjacent semiconductor structure.

* * * * *